United States Patent
Han et al.

(10) Patent No.: US 12,082,451 B2
(45) Date of Patent: Sep. 3, 2024

(54) DISPLAY DEVICE AND METHOD OF MANUFACTURING DISPLAY DEVICE

(71) Applicant: Samsung Display Co., LTD., Yongin-si (KR)

(72) Inventors: Ji Hye Han, Seoul (KR); Chul Min Bae, Hwaseong-si (KR); Chang Ok Kim, Hwaseong-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 0 days.

(21) Appl. No.: 17/991,396

(22) Filed: Nov. 21, 2022

(65) Prior Publication Data
US 2023/0086507 A1 Mar. 23, 2023

Related U.S. Application Data

(63) Continuation of application No. 16/879,291, filed on May 20, 2020, now Pat. No. 11,532,682.

(30) Foreign Application Priority Data

Oct. 8, 2019 (KR) ........................ 10-2019-0124475

(51) Int. Cl.
*H10K 59/124* (2023.01)
*H01L 29/786* (2006.01)
*H10K 59/121* (2023.01)
*H10K 59/122* (2023.01)
*H10K 59/131* (2023.01)
(Continued)

(52) U.S. Cl.
CPC ......... *H10K 59/124* (2023.02); *H01L 29/786* (2013.01); *H10K 59/1213* (2023.02); *H10K 59/122* (2023.02); *H10K 59/131* (2023.02); *H10K 71/00* (2023.02); *H10K 2102/00* (2023.02)

(58) Field of Classification Search
CPC .... H10K 59/124; H10K 59/131; H10K 71/00; H10K 59/1213; H10K 2102/00; H01L 29/786
USPC ........................................................... 257/40
See application file for complete search history.

(56) References Cited

U.S. PATENT DOCUMENTS

2015/0123084 A1 5/2015 Kim et al.
2016/0035805 A1 2/2016 Kim et al.
(Continued)

FOREIGN PATENT DOCUMENTS

JP 6357665 7/2018
JP 6416316 10/2018
KR 10-2018-0121574 11/2018

*Primary Examiner* — Dzung Tran
(74) *Attorney, Agent, or Firm* — KILE PARK REED & HOUTTEMAN PLLC

(57) ABSTRACT

A display device includes a base substrate including a display area and a non-display area around the display area are defined, a first interlayer insulating layer disposed on the base substrate, a second interlayer insulating layer disposed on the first interlayer insulating layer, a first semiconductor layer disposed on the second interlayer insulating layer and including an oxide, and a first gate insulating layer disposed on the first semiconductor layer, wherein the material of the first interlayer insulating layer and the material of the second interlayer insulating layer are different from each other. Methods of manufacturing a display device are also disclosed.

16 Claims, 22 Drawing Sheets

(51) Int. Cl.
  *H10K 71/00* (2023.01)
  *H10K 102/00* (2023.01)

(56) References Cited

U.S. PATENT DOCUMENTS

| | | |
|---|---|---|
| 2016/0181339 A1 | 6/2016 | Lee et al. |
| 2017/0141169 A1 | 5/2017 | Sim et al. |
| 2017/0256569 A1* | 9/2017 | Ohara ................ H01L 29/4908 |
| 2018/0061922 A1 | 3/2018 | Kim et al. |
| 2020/0152663 A1 | 5/2020 | Li |

* cited by examiner

| | | SiN$_X$ RELEASING EXCESSIVE AMOUNT OF HYDROGEN |
|---|---|---|
| FILM FORMATION CONDITIONS Gas Ratio | NH$_3$/SiH$_4$ | 4 |
| | N$_2$/SiH$_4$ | 10 |
| THIN FILM CHARACTERISTICS by FT-IR | [N-H]/[Si-H] ratio | 0.6 |
| | Total H | 19at% |
| RELEASE AMOUNT OF HYDROGEN | TDS |  |

| | | SiN$_X$ RELEASING LOW AMOUNT OF HYDROGEN |
|---|---|---|
| FILM FORMATION CONDITIONS Gas Ratio | NH$_3$/SiH$_4$ | 10 |
| | N$_2$/SiH$_4$ | 60 |
| THIN FILM CHARACTERISTICS by FT-IR | [N-H]/[Si-H] ratio | 22 |
| | Total H | 22at% |
| RELEASE AMOUNT OF HYDROGEN | TDS | |

| | | SiN$_X$ RELEASING MINIMUM AMOUNT OF HYDROGEN |
|---|---|---|
| FILM FORMATION CONDITIONS Gas Ratio | NH$_3$/SiH$_4$ | 0 |
| | N$_2$/SiH$_4$ | 180 |
| THIN FILM CHARACTERISTICS by FT-IR | [N-H]/[Si-H] ratio | 18 |
| | Total H | 14at% |
| RELEASE AMOUNT OF HYDROGEN | TDS | |

120 : 121
130 : 131, 133
150 : 151
160 : 161, 163, 165, 167, 169

120 : 121
130 : 131
150 : 151
160 : 161, 163, 165, 167, 169

DISPLAY DEVICE AND METHOD OF MANUFACTURING DISPLAY DEVICE

CROSS REFERENCE TO RELATED APPLICATION

This is a continuation application of U.S. patent application Ser. No. 16/879,291, filed May 20, 2020 (now U.S. Pat. No. 11,532,682 issued Dec. 20, 2022), the disclosure of which is incorporated herein by reference in its entirety. U.S. patent application Ser. No. 16/879,291 claims priority to and benefits of Korean Patent Application No. 10-2019-0124475 under 35 U.S.C. § 119, filed on Oct. 8, 2019, in the Korean Intellectual Property Office, the entire contents of which are incorporated herein by reference.

BACKGROUND

Technical Field

The disclosure relates to a display device and a method of manufacturing the display device.

Description of the Related Art

The importance of display devices is increasing along with the development of multimedia. Accordingly, various kinds of display devices, such as liquid crystal displays (LCDs) and organic light-emitting diode (OLED) displays, are being used. Among the display devices, the OLED displays display images using an organic light-emitting element which generates light through recombination of electrons and holes. The OLED display includes transistors which supply a driving current to the organic light-emitting element.

SUMMARY

An embodiment of the invention provides a display device in which a short circuit of an oxide semiconductor is prevented.

Another embodiment of the invention provides a method of manufacturing a display device in which a short circuit of an oxide semiconductor is prevented.

It should be noted that objects of the disclosure are not limited to the above-described objects, and other objects of the disclosure will be apparent to those skilled in the art from the following descriptions.

According to an embodiment, a display device may comprise a base substrate including a display area and a non-display area around the display area, a first interlayer insulating layer disposed on the base substrate, a second interlayer insulating layer disposed on the first interlayer insulating layer, a first semiconductor layer disposed on the second interlayer insulating layer, a first gate insulating layer disposed on the first semiconductor layer, a first gate electrode disposed above the first gate insulating layer, a third interlayer insulating layer disposed on the first gate electrode, and a first source electrode and a first drain electrode which are disposed on the third interlayer insulating layer and are electrically connected to the first semiconductor layer, wherein the material of the first interlayer insulating layer and the material of the second interlayer insulating layer are different from each other.

The display device may further comprise a second semiconductor layer disposed between the base substrate and the first interlayer insulating layer, a second gate insulating layer disposed between the second semiconductor layer and the first interlayer insulating layer, a second gate electrode disposed between the second gate insulating layer and the first interlayer insulating layer, a third gate insulating layer disposed between the second gate electrode and the first interlayer insulating layer, and a second source electrode and a second drain electrode which are disposed on the third gate insulating layer, wherein the second source electrode and the second drain electrode may be electrically connected to the second semiconductor layer.

The second interlayer insulating layer may comprise silicon oxide ($SiO_x$). The first interlayer insulating layer may comprise nitrogen, hydrogen, and silicon, wherein the nitrogen and hydrogen are combined through a first bond, the silicon and the hydrogen are combined through a second bond, and a ratio of the first bond to the second bond is in a range of about 15 to about 30.

A release amount (intensity (A)) of the hydrogen of the first interlayer insulating layer may be at most about 2.0E-09 at a temperature of at least about 350° C.

The first interlayer insulating layer may be include ammonia ($NH_3$) silane ($SiH_4$), and nitrogen ($N_2$) and a supply ratio of the ammonia ($NH_3$) to the silane ($SiH_4$) may be at least about five.

A supply ratio of the nitrogen ($N_2$) to the silane ($SiH_4$) may be at least about 30.

The first interlayer insulating layer may be include ammonia ($NH_3$), silane ($SiH_4$), and nitrogen ($N_2$) and a supply ratio of the ammonia ($NH_3$) to the silane ($SiH_4$) may be about zero.

A supply ratio of the nitrogen ($N_2$) to the silane ($SiH_4$) may be at least about 150.

The first semiconductor layer may include an oxide.

The second semiconductor layer may include crystallized silicon.

A width of the first gate insulating layer may be smaller than a width of the first semiconductor layer.

The first gate electrode may overlap the first gate insulating layer, and a width of the first gate electrode may be smaller than the width of the first semiconductor layer.

The display device may further include a fourth gate electrode between the base substrate and the first interlayer insulating layer, and the first gate electrode and the fourth gate electrode may be electrically connected.

The display device may further comprise a fourth gate electrode between the base substrate and the first interlayer insulating layer, wherein a width of the fourth gate electrode may be greater than a width of the first semiconductor layer, and the first source electrode or the first drain electrode may be electrically connected to the fourth gate electrode.

The display area may comprise a first area and a second area around the first area, the first semiconductor layer may be disposed in the first area, and the second semiconductor layer may be disposed in the second area.

The display device may further comprise a third gate electrode disposed between the third gate insulating layer and the second source and drain electrodes, and the second gate electrode and the third gate electrode may form a capacitor.

The display device may comprise a switching transistor including the first semiconductor layer, the first gate electrode, and the first source and drain electrodes. The display device may comprise a driving transistor including the second semiconductor layer, the second gate electrode, and the second source and drain electrodes.

According to another embodiment, a method of manufacturing a display device includes forming a first interlayer insulating layer on the base substrate, forming a second interlayer insulating layer including silicon oxide ($SiO_x$) on the first interlayer insulating layer, and forming a first semiconductor layer on the second interlayer insulating layer, wherein the first interlayer insulating layer comprises nitrogen, hydrogen, and silicon, and wherein the nitrogen and the hydrogen are combined through a first bond, the silicon and the hydrogen are combined through a second bond, and a ratio of the first bond to the second bond is in a range of 15 to 30.

A release amount (intensity (A)) of the hydrogen of the first interlayer insulating layer may be at most about 2.0E-09 at a temperature of at least about 350° C.

The forming of the first interlayer insulating layer may include supplying ammonia ($NH_3$), silane ($SiH_4$), and nitrogen ($N_2$), and a supply ratio of the ammonia ($NH_3$) to the silane ($SiH_4$) may be at least about 5.

The forming of the first interlayer insulating layer may include supplying the ammonia ($NH_3$), the silane ($SiH_4$), and the nitrogen ($N_2$), and a supply ratio of the nitrogen ($N_2$) to the silane ($SiH_4$) may be at least about 30.

The forming of the first interlayer insulating layer may include supplying ammonia ($NH_3$), silane ($SiH_4$), and nitrogen ($N_2$), and a supply ratio of the ammonia ($NH_3$) to the silane ($SiH_4$) may be about zero.

The forming of the first interlayer insulating layer may include supplying the ammonia ($NH_3$), the silane ($SiH_4$), and the nitrogen ($N_2$), and a supply ratio of the nitrogen ($N_2$) to the silane ($SiH_4$) may be at least about 150.

However, features of the invention are not restricted to the one set forth herein. The above and other features of the invention will become more apparent to one of ordinary skill in the art to which the invention pertains by referencing the detailed description of the invention given below.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
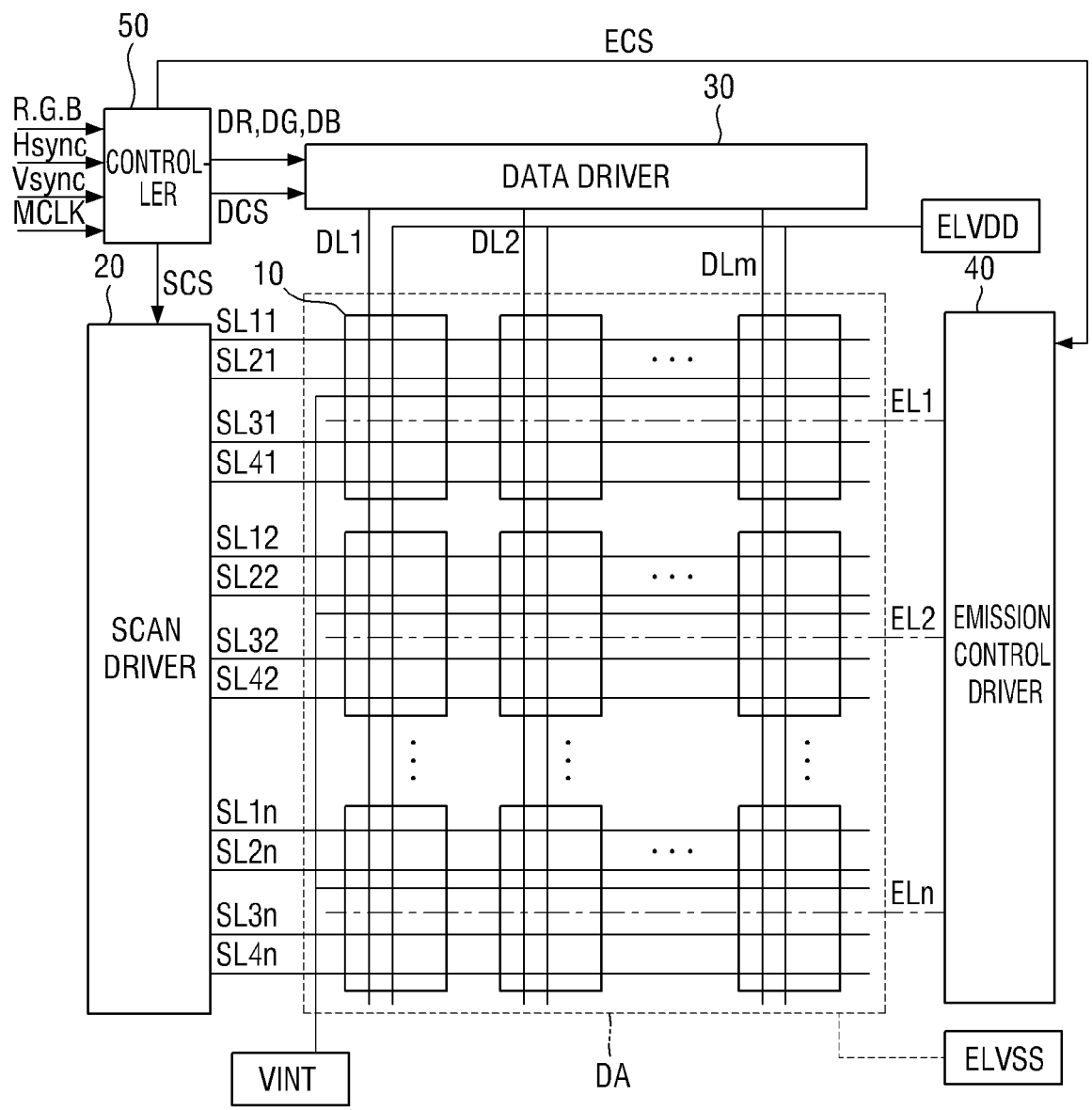
FIG. 1 is a schematic block diagram illustrating a display device according to an embodiment.

Advantages and features of the disclosure and methods for accomplishing the same will be more clearly understood from embodiments described below with reference to the accompanying drawings. However, the disclosure is not limited to the following embodiments but may be implemented in various forms. The embodiments are provided only to complete the disclosure and to fully provide a person having ordinary skill in the art to which the disclosure pertains within the field of the disclosure, and the disclosure will be defined by the claims.

It will be understood that when an element, such as a layer, film, region, substrate, or area is referred to as being "on" or "above" another element, it may be directly on or above another element or intervening elements or layers may be present therebetween. Further when an element such as a layer, film, region, substrate, or area, is referred to as being "below" another element, it may be directly below the other element, or intervening elements may be present therebetween. Like reference numerals generally denote like elements throughout the specification.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the drawings, sizes and thicknesses of elements may be enlarged for better understanding, clarity, and ease of description thereof. However, the disclosure is not limited to the illustrated sizes and thicknesses. In the drawings, for better understanding and ease of description, the thicknesses of layers, films, panels, regions, and other elements, may be exaggerated for clarity.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings. Hereinafter, a display device will be described by exemplifying an organic light-emitting display device.

FIG. 1 is a schematic block diagram illustrating a display device according to an embodiment.

Referring to FIG. 1, a display device 1 comprises a display area including pixels 10, a scan driver 20, a data driver 30 (see 900 of FIG. 3), an emission control driver 40, and a controller 50. The controller 50 functions to control the scan driver 20, the data driver 30, and the emission control driver 40. The controller 50 may be disposed on a main circuit board of FIG. 3 (see 500 of FIG. 3).

The display area of the display device 1 includes the pixels positioned at intersections of scan lines SL11 to SL1n, SL21 to SL2n, SL31 to SL3n, and SL41 to SL4n (n is an integer of at least two), data lines DL1 to DLm (m is an integer of at least two), and emission control lines EL1 to ELn or emission control lines EML1 to EMLn and arranged in a matrix form.

The scan lines SL11 to SL1n, SL21 to SL2n, SL31 to SL3n, and SL41 to SL4n, and the emission control lines EL1 to ELn may extend in a row direction, and the data lines DL1 to DLm may extend in a column direction. The row direction and the column direction may be switched with each other. A supply line of an initialization voltage VINT may be branched along rows and extend in the row direction, and a supply line of a first power voltage ELVDD may be branched along columns and extend in the column direction. However, the disclosure is not limited thereto, and an extending direction of the supply line of the initialization voltage VINT and an extending direction of the supply line of the first power voltage ELVDD may be variously modified.

Four scan lines SL11, SL21, SL31, and SL41, one data line DL1, one emission control line EL1, one supply line of the initialization voltage VINT, and one supply line of the first power voltage ELVDD may pass through a pixel in a first row and a first column which is a pixel. The same lines may pass through the other pixels.

The scan driver 20 may generate and transmit four scan signals to each pixel through the scan lines SL11 to SL1n, SL21 to SL2n, SL31 to SL3n, and SL41 to SL4n. For example, the scan driver 20 sequentially supplies scan signals to first scan lines SL11 to SL1n, second scan lines SL21 to SL2n, third scan lines SL31 to SL3n, or fourth scan lines SL41 to SL4n.

The data driver 30 transmits data signals to the pixels 10 through the data lines DL1 to DLm. The data signal is supplied to the pixel 10 selected by a second scan signal whenever the second scan signal is supplied to the second scan lines SL21 to SL2n.

The emission control driver 40 generates and transmits emission control signals to the pixels 10 through the emission control lines EML1 to EMLn. The emission control signal controls an emission time of the pixel 10. The emission control driver 40 may be omitted when the scan driver 20 generates the emission control signal as well as the scan signal, or according to an internal structure of the pixel 10.

The controller 50 converts image signals R, G, and B transmitted from the outside into image data signals DR, DG, and DB and transmits the converted image data signals DR, DG, and DB to the data driver 30. The controller 50 receives a vertical synchronization signal Vsync, a horizontal synchronization signal Hsync, and a clock signal MCLK and generates control signals for controlling driving of the scan driver 20, the data driver 30, and the emission control driver 40 to transmit the generated control signals to the scan driver 20, the data driver 30 and the emission control driver 40. For example, the controller 50 may generate and transmit a scan driving control signal SCS for controlling the scan driver 20, a data driving control signal DCS for controlling the data driver 30, and an emission driving control signal ECS for controlling the emission control driver 40, respectively.

Each of the pixels receives the first power voltage ELVDD and a second power voltage ELVSS. The first power voltage ELVDD may be a certain high level voltage, and the second power voltage ELVSS may be a voltage lower than the first power voltage ELVDD.

Each of the pixels 10 emits light having a certain luminance due to a driving current supplied to a light-emitting element on the basis of each of the data signals transmitted through the data lines DL1 to DLm.

The first power voltage ELVDD, the second power voltage ELVSS, the initialization voltage VINT, and the like may be supplied from an external voltage source.

Figure 2:
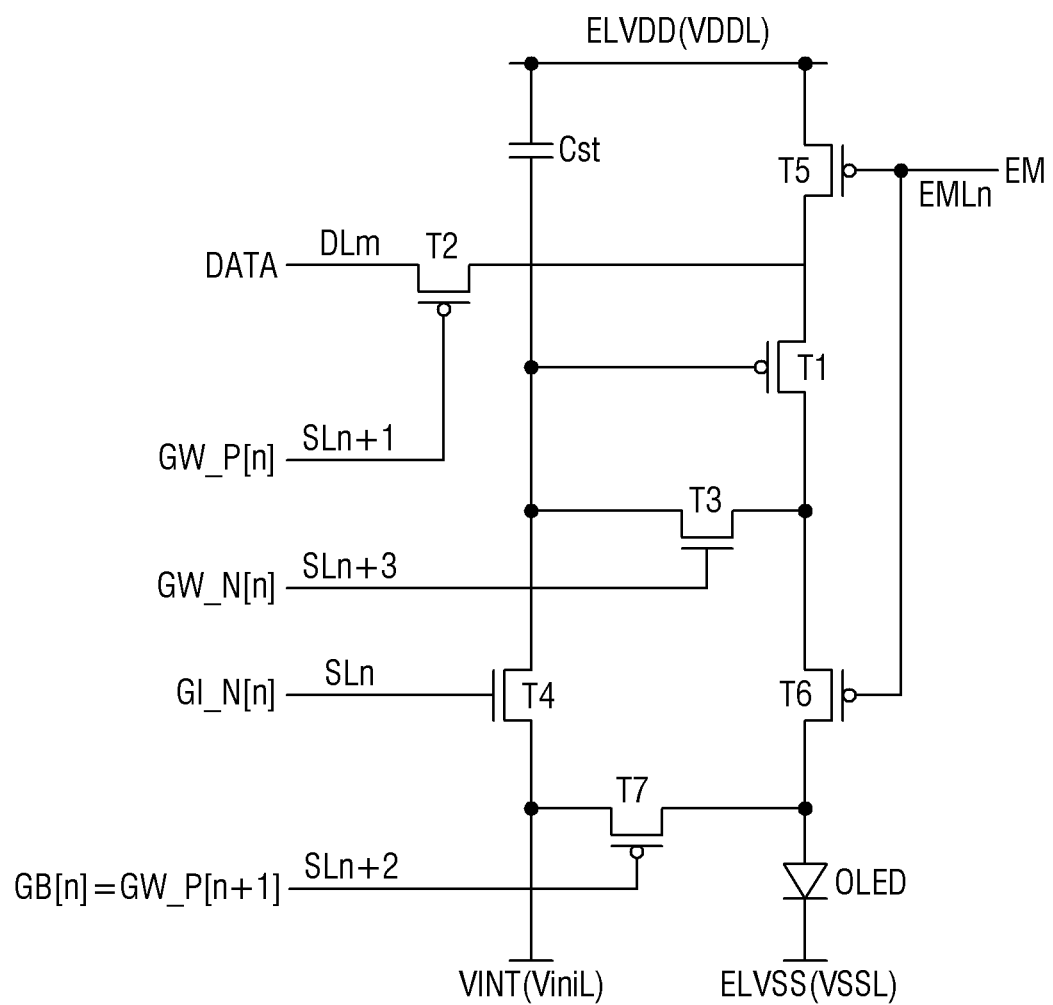
FIG. 2 is a schematic diagram of an equivalent circuit illustrating a pixel of the display device according to an embodiment.

FIG. 2 is a schematic diagram of an equivalent circuit illustrating one pixel of the display device according to the embodiment.

Referring to FIG. 2, a circuit of one pixel of the display device 1 includes an organic light-emitting diode OLED, transistors T1 to T7, and a storage capacitor Cst. A data signal DATA, a first scan signal GI_N(n), a second scan signal GW_P(n), a third scan signal GW_P(n+1), a fourth scan signal GW_N(n), an emission control signal EM, the first power voltage ELVDD, the second power voltage ELVSS, and the initialization voltage VINT are applied to the circuit of one pixel.

The organic light-emitting diode OLED includes an anode electrode and a cathode electrode. The storage capacitor Cst includes a first electrode and a second electrode.

The transistors may include first to seventh transistors T1 to T7. Each of the transistors T1 to T7 includes a gate electrode, a first electrode, and a second electrode. One of the first and second electrodes of each of the transistors T1 to T7 becomes a source electrode, and the other thereof becomes a drain electrode.

Each of the transistors T1 to T7 may be a thin film transistor.

The transistors T1 to T7 according to the embodiment include semiconductor layers. The semiconductor layers of the transistors T1 to T7 may include an oxide or crystallized silicon. For example, the semiconductor layers of the first transistor T1, the second transistor T2, the fifth transistor T5, the sixth transistor T6, and the seventh transistor T7 may each be made of the crystallized silicon. The semiconductor layers of the third transistor T3 and the fourth transistor T4 may each be made of the oxide.

The semiconductor layers of the first transistor T1, the second transistor T2, the fifth transistor T5, the sixth transistor T6, and the seventh transistor T7, which are made of the crystallized silicon, may be disposed to be coplanar with each other. The semiconductor layers of the third transistor T3 and the fourth transistor T4, which are made of the oxide, may be disposed to be coplanar with each other. The semiconductor layers of the first transistor T1, the second transistor T2, the fifth transistor T5, the sixth transistor T0, and the seventh transistor T7 may be disposed to not be coplanar with the semiconductor layers of the third transistor T3 and the fourth transistor T4.

The gate electrode of the first transistor T1 is connected to the first electrode of the storage capacitor Cst. The first electrode of the first transistor T1 is connected to a first power supply line VDDL for applying the first power voltage ELVDD via the fifth transistor T5. The second electrode of the first transistor T1 is connected to the anode electrode of the organic light-emitting diode OLED via the sixth transistor T6. The first transistor T1 receives the data signal DATA according to a switching operation of the second transistor T2 and supplies a driving current Id to the organic light-emitting diode OLED. For example, the first transistor T1 may be a driving transistor.

The gate electrode of the second transistor T2 is connected to a second scan line SLn+1 for applying the second scan signal GW_P(n). The first electrode of the second transistor T2 is connected to the data line DLm. The second electrode of the second transistor T2 is connected to the first electrode of the first transistor T1 and is also connected to the first power voltage supply line VDDL via the fifth transistor T5. The second transistor T2 is turned on in response to the second scan signal GW_P(n) to perform the switching operation of transmitting the data signal DATA to the first electrode of the first transistor T1.

The gate electrode of the third transistor T3 is connected to a fourth scan line SLn+3 for applying the fourth scan signal GW_N(n), and the first electrode of the third transistor T3 is connected to the first electrode of the sixth transistor T6 and the second electrode of the first transistor T1. The second electrode of the third transistor T3 is connected to the first electrode of the fourth transistor T4, the first electrode of the storage capacitor Cst, and the gate electrode of the first transistor T1.

The gate electrode of the fourth transistor T4 is connected to a first scan line SLn for applying the first scan signal GI_N(n). The second electrode of the fourth transistor T4 is connected to a supply line ViniL of the initialization voltage VINT and the first electrode of the seventh transistor T7. The first electrode of the fourth transistor T4 is connected to the second electrode of the third transistor T3, the gate electrode of the first transistor T1, and the first electrode of the storage capacitor Cst.

The gate electrode of the fifth transistor T5 is connected to the emission control line EMLn for applying the emission control signal EM. The first electrode of the fifth transistor T5 is connected to a terminal for the first power voltage ELVDD. The second electrode of the fifth transistor T5 is connected to the first electrode of the first transistor T1 and the second electrode of the second transistor T2.

The gate electrode of the sixth transistor T6 is connected to the emission control line EMLn for applying the emission control signal EM. The first electrode of the sixth transistor T6 is connected to the second electrode of the first transistor T1 and the first electrode of the third transistor T3. The second electrode of the sixth transistor T6 is connected to the anode electrode of the organic light-emitting diode OLD) and the second electrode of the seventh transistor T7.

The fifth transistor T5 and the sixth transistor T6 are concurrently turned on in response to the emission control signal EM so that the driving current Id flows in the organic light-emitting diode OLED.

The gate electrode of the seventh transistor T7 is connected to a third scan line SLn+2 for applying the third scan signal GW_P(n+1). The first electrode of the seventh transistor T7 is connected to the second electrode of the fourth transistor T4 and the supply line ViNIL of the initialization voltage VINT, and the second electrode of the seventh transistor T7 is connected to the anode electrode of the organic light-emitting diode OLED and the second electrode of the sixth transistor T6.

The second to seventh transistors T2 to T7 may be switching transistors.

The second electrode of the storage capacitor Cst is connected to the first power voltage supply line VDDL. The first electrode of the storage capacitor Cst is connected to the gate electrode of the first transistor T1, the second electrode of the third transistor T3, and the first electrode of the fourth transistor T4. The cathode electrode of the organic light-emitting diode OLED is connected to a supply line VSSL of the second power voltage ELVSS. The organic light-emitting diode OLED receives the driving current Id from the first transistor T1 and emits light to display an image.

Figure 3:
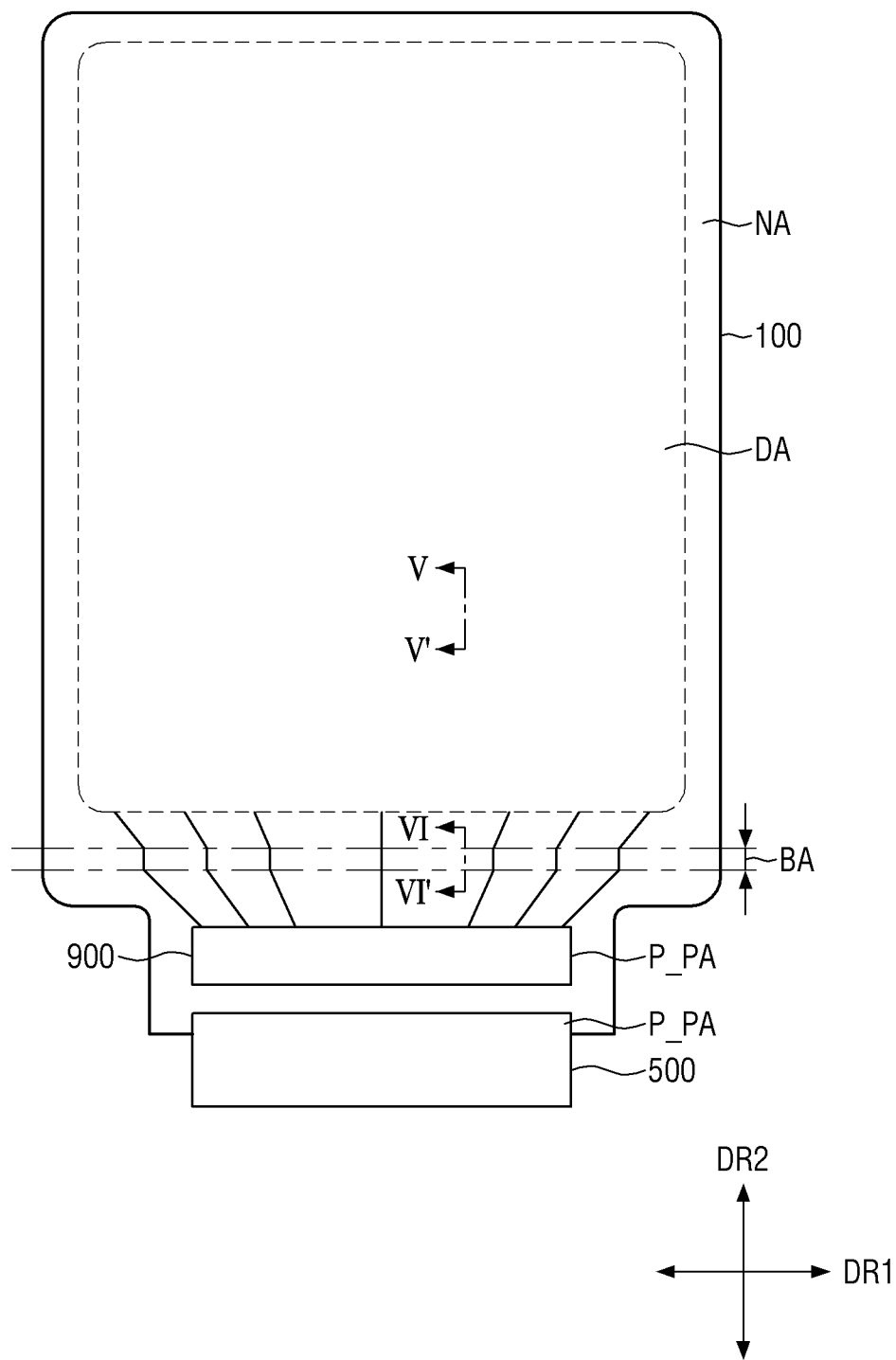
FIG. 3 is a plan layout illustrating the display device according to an embodiment.
Figure 4:
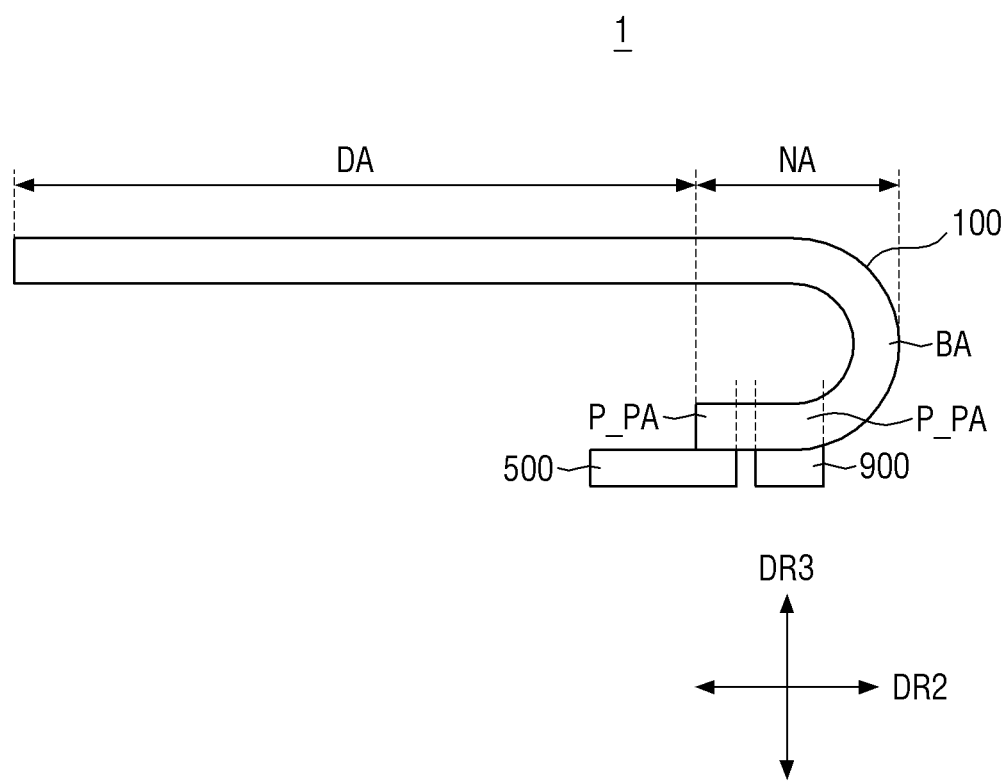
FIG. 4 is a schematic cross-sectional view illustrating the bent display device according to an embodiment.
Figure 5:
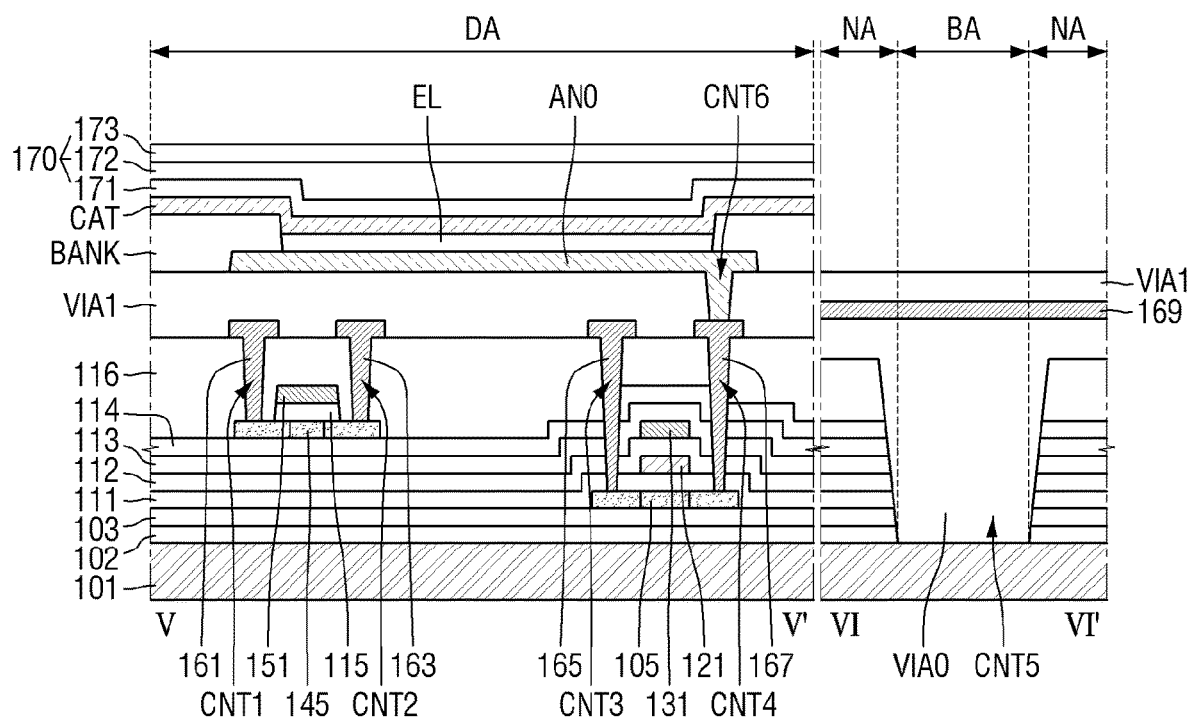
FIG. 5 shows schematic cross-sectional views taken along line V-V' and line VI-VI' of FIG. 3.

FIG. 3 is a plan layout illustrating the display device according to the embodiment. FIG. 4 is a schematic cross-sectional view illustrating the bent display device according to the embodiment. FIG. 5 shows cross-sectional views taken along line V-V' and line VI-VI' of FIG. 3.

Referring to FIGS. 3 to 5, the display device 1 may include a display panel 100 that displays an image, a driving integrated circuit 900 attached onto the display panel 100, and a main circuit board 500 connected to the display panel 100.

In the embodiment, the driving integrated circuit 900 may be applied as a chip on plastic (COP). However, the disclosure is not limited thereto, and the driving integrated circuit 900 may be applied as a chip on glass (COG).

The display panel 100 may be an organic light-emitting display panel. A case in which the display panel 100 is the organic light-emitting display panel will be described in the following embodiments. However, the disclosure is not limited thereto, and examples of the display panel 100 may include other types of display panels such as a liquid crystal display (LCD) panel, a quantum dot organic light-emitting diode (QD-OLED) display panel, a quantum dot LCD (OD-LCD) panel, a quantum nano light-emitting display (Nano LED) panel, and a micro light-emitting display (Micro LED) panel.

The display panel 100 includes a display area DA including pixel areas and a non-display area NA disposed around the display area DA. The display area DA may have a rectangular shape of which corners are a right angle in the plan view or may have a rectangular shape of which corners are rounded in the plan view. The display area DA may have a short side and a long side. The short side of the display area DA may be a side extending in a first direction DR1. The long side of the display area DA may be a side extending in a second direction DR2. A planar shape of the display area DA is not limited to the rectangular shape, and the display area DA may have a circular shape, an elliptical shape, or other various shapes. The non-display area NA may be disposed adjacent to two short sides and two long sides of the display area DA. The non-display area NA may surround all sides of the display area DA and form an edge of the display area DA. However, the disclosure is not limited thereto, and the non-display area NA may be disposed adjacent to only the two short sides or two long sides of the display area DA.

The non-display area NA of the display panel 100 further includes panel pad areas P_PA. The panel pad areas P_PA may be disposed, for example, around one short side of the display area DA. However, the disclosure is not limited thereto, and the panel pad areas P_PA may be disposed around the two short sides of the display area DA or may be disposed around the two short sides and two long sides of the display area DA.

The above-described driving integrated circuit 900 may be disposed in the panel pad area P_PA. The driving integrated circuit 900 may be disposed directly in the panel pad area P_PA of the display panel 100.

The main circuit board 500 may be connected to the panel pad area P_PA of the display panel 100. The panel pad area P_PA in which the main circuit board 500 is disposed may be positioned at a lower level in the second direction DR2 as compared with the panel pad area P_PA in which the driving integrated circuit 900 is disposed. The main circuit board 500 may be attached onto pads provided in the panel pad area P_PA of the display panel 100 using an anisotropic conductive film. In some embodiments, the main circuit board 500 may be attached to one side of the display panel 100 through ultrasonic bonding. The above-described controller 50 (see FIG. 1) may be disposed on the main circuit board 500.

The driving integrated circuit 900 outputs signals and voltages for driving the display panel 100 on the basis of signals generated by the controller 50 disposed on the main circuit board 500. The driving integrated circuit 900 may be formed as an integrated circuit, but the disclosure is not limited thereto.

The non-display area NA of the display panel 100 may further include a bent area BA.

A base substrate 101 (see FIG. 5) of the display panel 100 may be made of an insulating material such as a polymer resin. Examples of a polymeric material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may be a flexible substrate which is bendable, foldable, and rollable. An example of a material constituting the flexible substrate may be PI, but the disclosure is not limited thereto.

The bent area BA may be disposed between an array of the pixels and the panel pad area P_PA. The bent area BA may be positioned in the non-display area NA. The display panel 100 may be folded in one direction with respect to a bending line that is a reference line disposed in the bent area BA. The bending line may be a straight line parallel to a lower side (or an upper side) of the display panel 100. As shown in FIG. 4, the bent area BA of the display panel 100 may be bent downward in a third direction DR3.

The panel pad areas P_PA of the display panel 100 may be disposed below the display area DA of the display panel 100. Therefore, the driving integrated circuit 900 and the main circuit board 500 attached to the panel pad areas P_PA of the display panel 100 may be disposed below the display area DA of the display panel 100 along with the panel pad areas P_PA of the bent display panel 100.

However, the disclosure is not limited thereto, and the display area FDA and the panel pad areas P_PA may be connected to each other without the bent area BA. For example, both the display area DA and the non-display area NA of the display panel 100 may be flat without the bent area BA.

Referring to FIG. 5, the display panel 100 includes the base substrate 101, conductive layers disposed on the base substrate 101, and insulating layers disposed between the conductive layers. FIG. 5 shows cross-sectional structures of one pixel of the display area DA and the non-display area NA of the display panel 100. Furthermore, FIG. 5 shows a cross-sectional structure of the bent area BA of the non-display area NA.

In the display panel 100, the base substrate 101, a buffer layer 102, a barrier layer 103, a first semiconductor layer 105, a first insulating layer 111, a first conductive layer 120, a second insulating layer 112, a second semiconductor layer 145, a third insulating layer 115, a second conductive layer 130, a third interlayer insulating layer 116, a bending via layer VIA0, a third conductive layer 150, a first via layer VIA1, a pixel electrode ANO, and a bank layer BANK may be sequentially disposed. Each of the above-described layers may be formed as a single film but may also be formed as a stacked film including a plurality of films. Other layers may be further disposed between the respective layers.

The base substrate 101 supports the respective layers disposed thereon. The display area DA, the non-display area NA, and the bent area BA of the non-display area NA may be defined in the base substrate 101. The display area IDA may include a first area in which a transistor including a semiconductor layer made of an oxide is disposed and a second area which is disposed around the first area and in which a transistor including a semiconductor layer made of crystallized silicon is disposed. As described above, the third transistor T3 and the fourth transistor T4, which include the semiconductor layer made of the oxide, may be disposed in the first area. As described above, the first transistor T1, the second transistor T2, and the fifth transistor T5 to the seventh transistor T7, which include the semiconductor layer made of the crystallized silicon, may be disposed in the second area.

When an organic light-emitting display device is a bottom emission type or a double-sided emission type, a transparent substrate may be used. When the organic light-emitting display device is a top emission type, a semi-transparent or opaque substrate as well as a transparent substrate may be applied.

The buffer layer 102 may be disposed on the base substrate 101. The buffer layer 102 may prevent diffusion of impurity ions, prevent permeation of moisture or ambient air, and perform a surface planarization function. The buffer layer 102 may include silicon nitride, silicon oxide, silicon oxynitride, or the like. The buffer layer 102 may be omitted according to the type of the substrate 101, process conditions, and the like.

The barrier layer 103 may be disposed on the buffer layer 102. The barrier layer 103 may be made of at least one selected from silicon nitride, silicon oxide, and silicon oxynitride. The barrier layer 103 may be omitted according to the type of the substrate 101, process conditions, and the like.

The first semiconductor layer 105 may be disposed on the barrier layer 103. The first semiconductor layer 105 may be disposed in the second area of the base substrate 101.

The first semiconductor layer 105 may be made of amorphous silicon, polysilicon, or the like. The polysilicon may be formed by crystallizing the amorphous silicon. A method of crystallizing the amorphous silicon may include various methods including rapid thermal annealing (RTA), solid phase crystallization (SPC), excimer laser annealing (ELA), metal induced crystallization (MIC), metal induced lateral crystallization (MILC), and sequential lateral solidification (SLS).

The first semiconductor layer 105 may include a channel region disposed to overlap a second gate electrode 121 thereabove in a thickness direction thereof and source/drain regions disposed at one side and the other side of the channel region. The source/drain regions may contain majority carrier ions as compared with the channel region, and thus electrical resistance thereof may be lower than electrical resistance of the channel region.

The first semiconductor layer 105 may be a semiconductor layer of the above-described first transistor T1, second transistor T2, fifth transistor T5, sixth transistor T6, and seventh transistor T7.

The first insulating layer 111 may be disposed on the first semiconductor layer 105. The first insulating layer 111 may be a gate insulating film having a gate insulating function. For example, the first insulating layer 111 may be a first gate insulating film. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 111 may be a single film or a multilayer film including a stacked film of different materials.

The first conductive layer 120 is disposed on the first insulating layer 111. The first conductive layer 120 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a multilayer film.

The first conductive layer 120 may include the second gate electrode 121 disposed in the second area. The second gate electrode 121 may overlap the channel region of the first semiconductor layer 105 in a thickness direction thereof. A planar size of the second gate electrode 121 may be the same as a planar size of the channel region of the first semiconductor layer 105 but is not limited thereto.

The second insulating layer 112 or a second gate insulating layer may be disposed on the first conductive layer 120. The second insulating layer 112 may be a gate insulating film having a gate insulating function. The second insulating layer 112 may include a silicon compound, a metal oxide, or the like. For example, the second insulating layer 112 may include silicon oxide, silicon nitride, silicon oxynitride, aluminum oxide, tantalum oxide, hafnium oxide, zirconium oxide, titanium oxide, or the like. These may be used alone or in combination with each other. The second insulating layer 112 may be a single film or a multilayer film including a stacked film of different materials.

The second conductive layer 130 may be disposed on the second insulating layer 112. The second conductive layer 130 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 130 may be a single film or a multilayer film.

The second conductive layer 130 may include a third gate electrode 131 disposed in the second area. The third gate electrode 131 and the second gate electrode 121 may form a capacitor. For example, the third gate electrode 131 and the second gate electrode 121 may form a capacitor using the second insulating layer 112 as a dielectric.

An interlayer insulating layer may be disposed on the second conductive layer 130. The interlayer insulating layer disposed on the second conductive layer 130 may include stacked films. In an embodiment, a first interlayer insulating layer 113 and a second interlayer insulating layer 114 disposed on the first interlayer insulating layer 113 may be disposed on the second conductive layer 130.

The first interlayer insulating layer 113 may be made of silicon nitride ($SiN_x$) or the like, and the second interlayer insulating layer 114 may be made of silicon oxide ($SiO_x$). The first interlayer insulating layer 113 may prevent hydrogen from flowing into the second semiconductor layer 145, which is to be described below, from under the first interlayer insulating layer 113. Since the first interlayer insulating layer 113 is made of silicon nitride ($SiN_x$) releasing a small amount of hydrogen, the first interlayer insulating layer 113 may reduce an amount of hydrogen that may flow into the second semiconductor layer 145.

A concentration of hydrogen in the second interlayer insulating layer 114 may be smaller than a concentration of hydrogen in the first interlayer insulating layer 113. Like the first interlayer insulating layer 113, the second interlayer insulating layer 114 may serve to prevent hydrogen from flowing into the second semiconductor layer 145 from under the second interlayer insulating layer 114. However, hydrogen inflow characteristics may be lower as compared with the first interlayer insulating layer 113. The second interlayer insulating layer 114 may serve to prevent moisture or ambient air from being introduced into the second semiconductor layer 145 in addition to a hydrogen inflow preventing function.

The second semiconductor layer 145 may be disposed on the second interlayer insulating layer 114. The second semiconductor layer 145 may be disposed in the first area of the base substrate 101. The second semiconductor layer 145 may be made of an oxide. For example, the second semiconductor layer 145 may be an oxide semiconductor layer.

The oxide of the second semiconductor layer 145 may include at least one oxide selected from gallium indium zinc oxide (G-I-Z-O) and an oxide combined with zinc (Zn), indium (In), gallium (Ga), tin (Sn), cadmium (Cd), germanium (Ge), hafnium (Hf), or a combination thereof. The oxide of the second semiconductor layer 145 may include at least one selected from among indium gallium zinc oxide (IGZO), zinc tin oxide (ZTO), and indium tin oxide (ITO).

The second semiconductor layer 145 may include a channel region disposed to overlap a first gate electrode 151 thereabove in a thickness direction thereof, and source/drain regions disposed at one side and the other side of the channel region. Majority carrier ions may be included in the channel region and the source/drain regions of the second semiconductor layer 145. An annealing or conductive process may be performed on the source/drain regions of the second semiconductor layer 145. When the annealing or conductive process is performed on the source/drain regions of the second semiconductor layer 145, the majority carrier ions may be included in the source/drain regions. The majority carrier ions included in the source/drain regions may be moved to the adjacent channel region of the second semiconductor layer 145. The majority carrier ions may be hydrogen ions. The source/drain regions may further include the majority carrier ions as compared with the channel region, and thus electrical resistance thereof may be lower than electrical resistance of the channel region.

When an amount of the majority carrier ions, for example, the hydrogen ions, is greater than a reference value in the channel region of the second semiconductor layer 145, a threshold voltage Vth may be lowered due to lowered electrical resistance, which may cause a short circuit of a channel.

In particular, a short channel method is applied in which a width of the channel region of the second semiconductor layer 145 according to the embodiment is smaller than a width of the source region or the drain region. Thus, when the channel of the second semiconductor layer 145 includes hydrogen ions in an amount greater than the reference value, the short circuit of the channel may be likely to occur.

The second semiconductor layer 145 may be a semiconductor layer of the above-described third transistor T3 and fourth transistor T4.

The third insulating layer 115 may be disposed on the second semiconductor layer 145. The third insulating layer 115 may be a gate insulating film having a gate insulating function. For example, the third insulating layer 115 may be a third gate insulating layer. The third insulating layer 115 may include a silicon compound, a metal oxide, or the like. For example, the third insulating layer 115 may include silicon oxide, silicon nitride, silicon oxynitride, aluminum oxide, tantalum oxide, hafnium oxide, zirconium oxide, titanium oxide, or the like. These may be used alone or in combination with each other. The third insulating layer 115 may be a single film or a multilayer film including a stacked film of different materials.

A width of the third insulating layer 115 may be smaller than a width of the second semiconductor layer 145. For example, the third insulating layer 115 may be disposed to overlap the channel region of the second semiconductor layer 145, may extend further outward to overlap a portion of each of the source region and the drain region of the second semiconductor layer 145, and may expose the other portion of each of the source region and the drain region.

Since the width of the third insulating layer 115 is smaller than the width of the second semiconductor layer 145 and the third insulating layer 115 exposes the other portion of each of the source/drain regions and covers the channel region, during an annealing or conductive process of the second semiconductor layer 145, more heat may be applied to the source/drain regions of the second semiconductor layer 145, thereby lowering electrical resistance. Since the channel region is covered by the second insulating layer 115, during the annealing treatment process of the second semiconductor layer 145, majority carrier ions may be suppressed from being generated in the channel region, thereby preventing electrical resistance from being lowered.

The third conductive layer 150 may be disposed on the third insulating layer 115. The third conductive layer 150 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single film or a multilayer film.

The third conductive layer 150 may include the first gate electrode 151 disposed in the first area.

The third interlayer insulating layer 116 may be disposed on the third conductive layer 150. The third interlayer insulating layer 116 may be an interlayer insulating film having an interlayer insulating function. The third interlayer insulating layer 116 may include a silicon compound, a metal oxide, or the like. For example, the third interlayer insulating layer 116 may include silicon oxide, silicon nitride, silicon oxynitride, aluminum oxide, tantalum oxide, hafnium oxide, zirconium oxide, titanium oxide, or the like. These may be used alone or in combination with each other. The third interlayer insulating layer 116 may be a single film or a multilayer film including a stacked film of different materials.

A thickness of the third interlayer insulating layer 116 may be greater than a thickness of the above-described first insulating layer 111. The first insulating layer 111 may be formed to have the same thickness over an entire surface thereof and thus conformally reflect a lower stepped portion. However, unlike the first insulating layer 111, the third interlayer insulating layer 116 may not conformally reflect a stepped portion of a lower structure. Accordingly, the third interlayer insulating layer 116 may serve to allow a fourth conductive layer 160 disposed thereon to be disposed to be flat.

On the other hand, the buffer layer 102, the barrier layer 103, the first insulating layer 111, the second insulating layer 112, the first interlayer insulating layer 113, the second interlayer insulating layer 114, and the third interlayer insulating layer 116 may not be disposed in the bent area BA. Since the buffer layer 102, the barrier layer 103, the first insulating layer 111, the second insulating layer 112, the first interlayer insulating layer 113, the second interlayer insulating layer 114, and the third interlayer insulating layer 116 are not disposed in the bent area BA, an upper surface of the base substrate 101 may be exposed. For example, a fifth contact hole CNT5 or a via hole may be further formed in the bent area BA to pass through the buffer layer 102, the barrier layer 103, the first insulating layer 111, the second insulating layer 112, the first interlayer insulating layer 113, the second interlayer insulating layer 114, and the third interlayer insulating layer 116. Side surfaces of the buffer layer 102, the barrier layer 103, the first insulating layer 111, the second insulating layer 112, the first interlayer insulating layer 113, the second interlayer insulating layer 114, and the third interlayer insulating layer 116 may be exposed in the bent area BA. The side surfaces of the buffer layer 102, the barrier layer 103, the first insulating layer 111, the second insulating layer 112, the first interlayer insulating layer 113, the second interlayer insulating layer 114, and the third interlayer insulating layer 116 may be arranged with each other, but the disclosure is not limited thereto.

The fifth contact hole CNT5 or the via hole may be formed concurrently in a process of forming first to fourth contact holes CNT1 to CNT4 to be described below.

Therefore, when the above-described display device 1 is bent in the bent area possible bending stress may be prevented.

The bending via layer VIA0 may be disposed in the fifth contact hole CNT5 or the via hole. The bending via layer VIA0 may be disposed on the third interlayer insulating layer 116 in the non-display area NA and may be disposed on the exposed side surfaces of the buffer layer 102, the barrier layer 103, the first insulating layer 111, the second insulating layer 112, the first interlayer insulating layer 113, the second interlayer insulating layer 114, and the third interlayer insulating layer 116 in the bent area BA. The bending via layer VIA0 may be in direct contact with the exposed upper surface of the base substrate 101.

The bending via layer VIM may include an inorganic insulating material or an organic insulating material such as a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, or benzocyclobutene (BCB). The bending via layer VIA0 may be a single film or a multilayer film including a stacked film of different materials The fourth conductive layer 160 may be disposed on the third interlayer insulating layer 116. The fourth conductive layer 160 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ix), chromium (Cr), calcium (Ca), titanium (Ti), tantalum (Ta), tungsten (W), and copper (Cu). The fourth conductive layer 160 may be a single film or a multilayer film.

The fourth conductive layer 160 may include first source/drain electrodes 161 and 163 disposed in the first area and second source/drain electrodes 165 and 167 disposed in the second area.

The first source/drain electrodes 161 and 163 may be connected to the source/drain regions of the second semiconductor layer 145, and the second source/drain electrodes 165 and 167 may be connected to the source/drain regions of the first semiconductor layer 105.

The first source/drain electrodes 161 and 163 may be connected to the source/drain regions of the second semiconductor layer 145 through the first contact hole CNT1 and the second contact hole CNT2. Each of the first contact hole CNT1 and the second contact hole CNT2 may be formed in the first area and may pass through the third interlayer insulating layer 116.

The second source/drain electrodes 165 and 167 may be connected to the source/drain regions of the first semiconductor layer 105 through the third contact hole CNT3 and the fourth contact hole CNT4. Each of the third contact hole CNT3 and the fourth contact hole CNT4 may be formed in the second area and may pass through the third interlayer insulating layer 116, the second interlayer insulating layer 114, and the first interlayer insulating layer 113 in a thickness direction thereof.

The fourth conductive layer 160 may further include a connection electrode 169 in the non-display area NA and the bent area BA. The connection electrode 169 may be connected to a scan line, a data line, or a power voltage line of the above-described pixel and may be connected to the panel pad area P_PA to form pads of the display panel 100.

The connection electrode 169 may be formed in the same manner as the first source/drain electrodes and may be made of the same material as the first source/drain electrodes.

The first via layer VIA1 may be disposed on the fourth conductive layer 160. The first via layer VIA1 may be disposed in the display area DA and the non-display area NA.

The first via layer VIA1 may include an inorganic insulating material or an organic insulating material such as a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, or BCB. The first via layer VIA1 may be a single film or a multilayer film including a stacked film of different materials.

The pixel electrode ANO may be disposed on the first via layer VIA1. The pixel electrode ANO may be an anode electrode. The pixel electrode ANO may be electrically connected to the second source electrode 165 or the second drain electrode 167 through a sixth contact hole CNT6 passing through the first via layer VIA1. The pixel electrode ANO may be connected directly to the second source electrode 165 or the second drain electrode 167 through the sixth contact hole CNT6 without going through the connection electrode or the like.

The pixel electrode ANO may be disposed separately for each pixel.

The bank layer BANK may be disposed on the pixel electrode ANO. The bank layer BANK may partially expose the pixel electrode ANO. The bank layer BANK may be made of an organic insulating material or an inorganic insulating material. For example, the bank layer BANK may be made of at least one selected from among a photoresist, a polyimide-based resin, an acrylic-based resin, a silicon compound, and a polyacrylic-based resin.

An organic layer EL may be disposed on an upper surface of the pixel electrode ANO and in an opening of the bank layer BANK. A cathode electrode CAT may be disposed on the organic layer EL and the bank layer BANK. The cathode electrode CAT may be a common electrode disposed on pixels.

The pixel electrode ANO, the organic layer EL, and the cathode electrode CAT may constitute an organic light-emitting element.

A thin film encapsulation layer 170 may be disposed on the cathode electrode CAT. The thin film encapsulation layer 170 may cover the organic light-emitting element (OLED). The thin film encapsulation layer 170 may be a stacked film in which an inorganic film and an organic film are alternately stacked. For example, the thin film encapsulation layer 170 may include a first encapsulation inorganic film 171, an encapsulation organic film 172, and a second encapsulation inorganic film 173 which are sequentially stacked.

Figure 6:
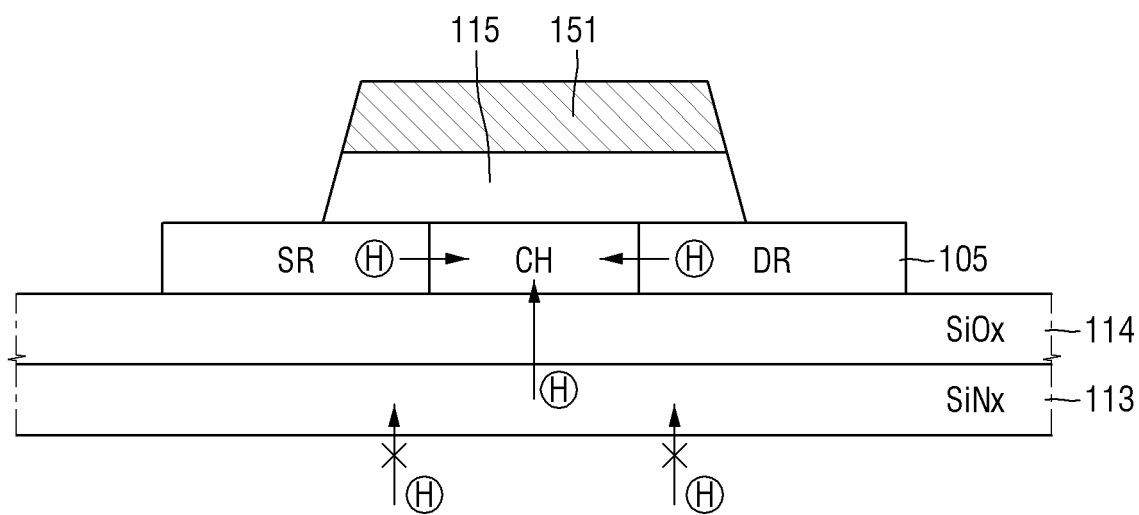
FIG. 6 is a schematic diagram illustrating hydrogen molecules flowing into a second semiconductor layer including an oxide.

FIG. 6 is a schematic diagram illustrating hydrogen molecules flowing into the second semiconductor layer including an oxide.

Referring to FIG. 6, as described above, the second semiconductor layer 145 may include a channel region CH, a source region SR positioned at one side of the channel region CH, and a drain region positioned at the other side of the channel region CH.

Hydrogen ions may flow into the channel region CH. There may be several routes through which hydrogen ions flow into the channel region CH. For example, as shown in FIG. 6, there may be a first route through which hydrogen ions flow from under the first interlayer insulating layer 113, a second route through which hydrogen ions are discharged from the first interlayer insulating layer 113 to flow into the channel region CH, and a third route through which hydrogen ions flow from the drain region CH and the drain region CH which are annealed.

Hydrogen may flow from the third insulating layer 115, and hydrogen may flow from above the third insulating layer 115.

As described above, when an amount of hydrogen greater than a reference value flows into the second semiconductor layer 145, a short circuit may occur in the channel region CH of the second semiconductor layer 145.

In the display device 1 according to the embodiment, the first interlayer insulating layer 113 including silicon nitride with excellent hydrogen inflow characteristics may be further disposed below the second interlayer insulating layer 114, thereby greatly reducing a degree in which hydrogen ions flow into the channel region CH.

In order to reduce a release amount of hydrogen of the first interlayer insulating layer 113, the first interlayer insulating layer 113 releasing a small amount of hydrogen may be formed by adjusting input amounts of ammonia ($NH_3$), nitrogen ($N_2$), and silane ($SiH_4$) in a thin film process. A release amount of hydrogen of the first interlayer insulating layer 113 may be a release amount of hydrogen during an annealing process of the second semiconductor layer 145.

Figure 7:
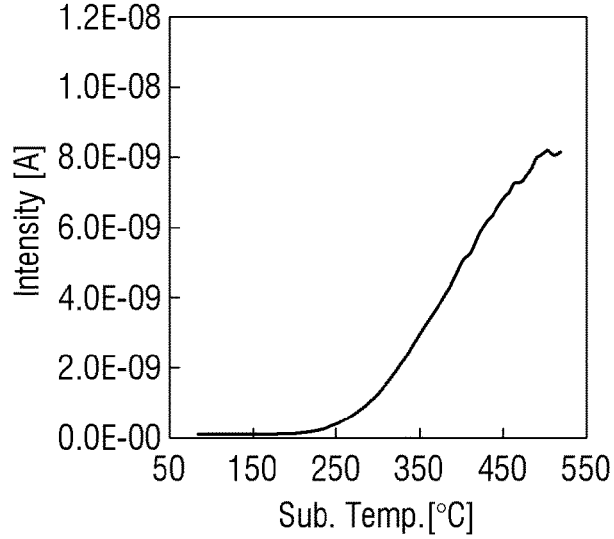
FIG. 7 is a table showing film formation conditions, thin film characteristics, and a release amount of hydrogen of silicon nitride releasing an excessive amount of hydrogen.
Figure 8:
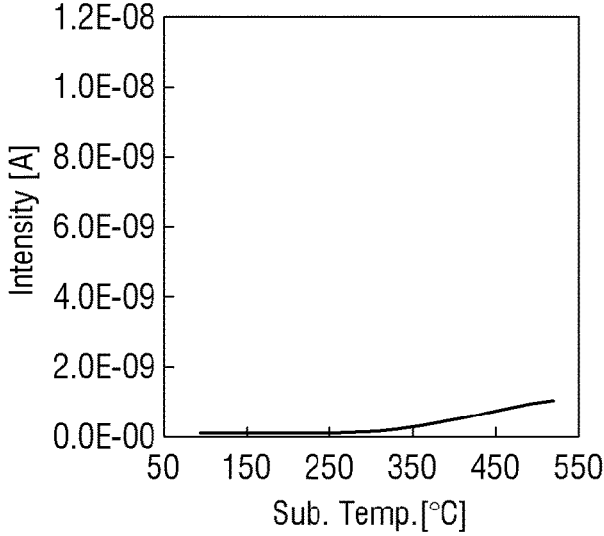
FIG. 8 is a table showing film formation conditions, thin film characteristics, and a release amount of hydrogen of silicon nitride releasing a low amount of hydrogen.
Figure 9:
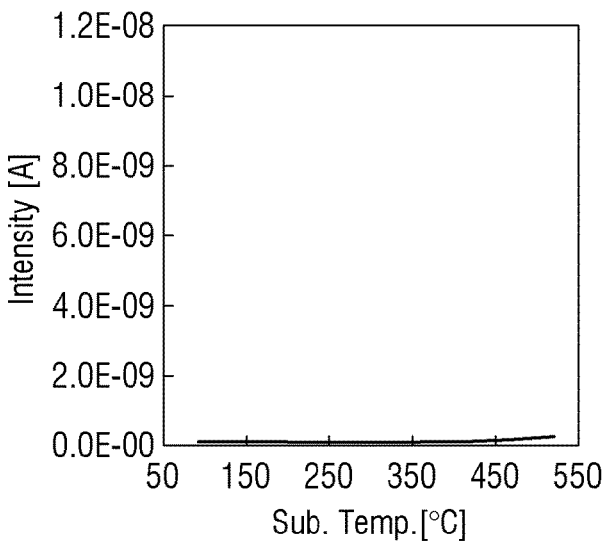
FIG. 9 is a table showing film formation conditions, thin film characteristics, and a release amount of hydrogen of silicon nitride releasing a minimum amount of hydrogen.
Figure 10:
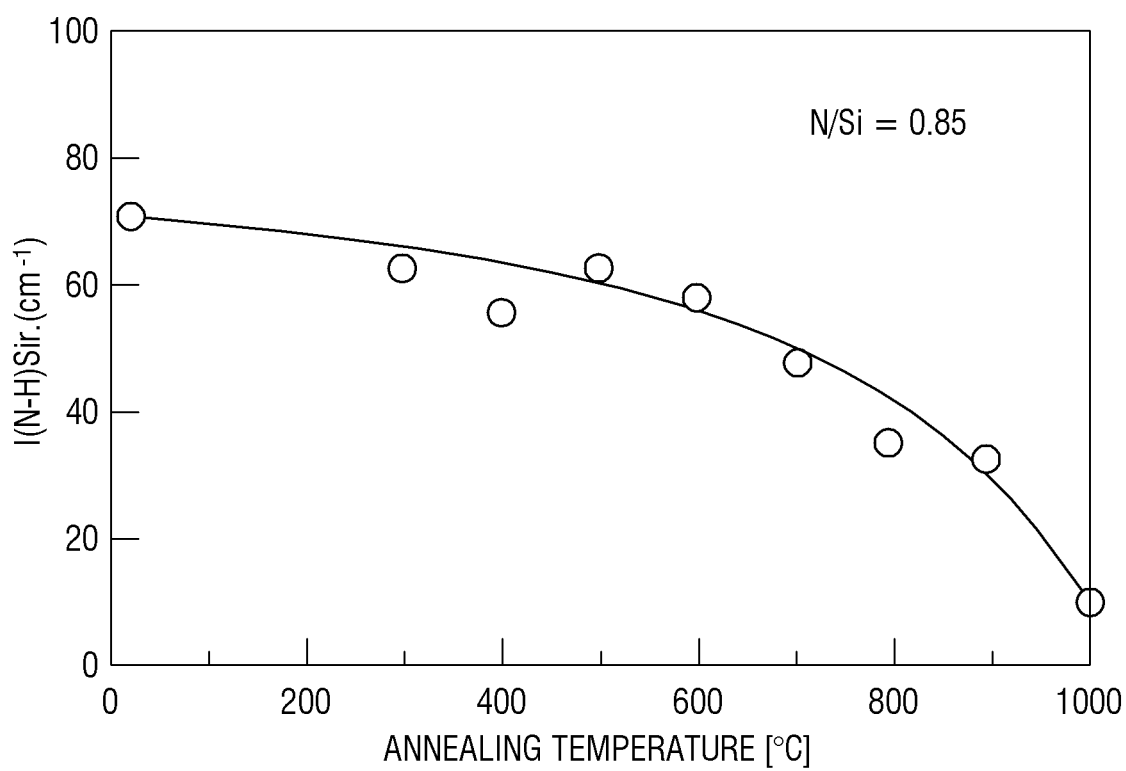
FIG. 10 is a graph showing a binding rate of nitrogen and hydrogen according to a temperature.
Figure 11:
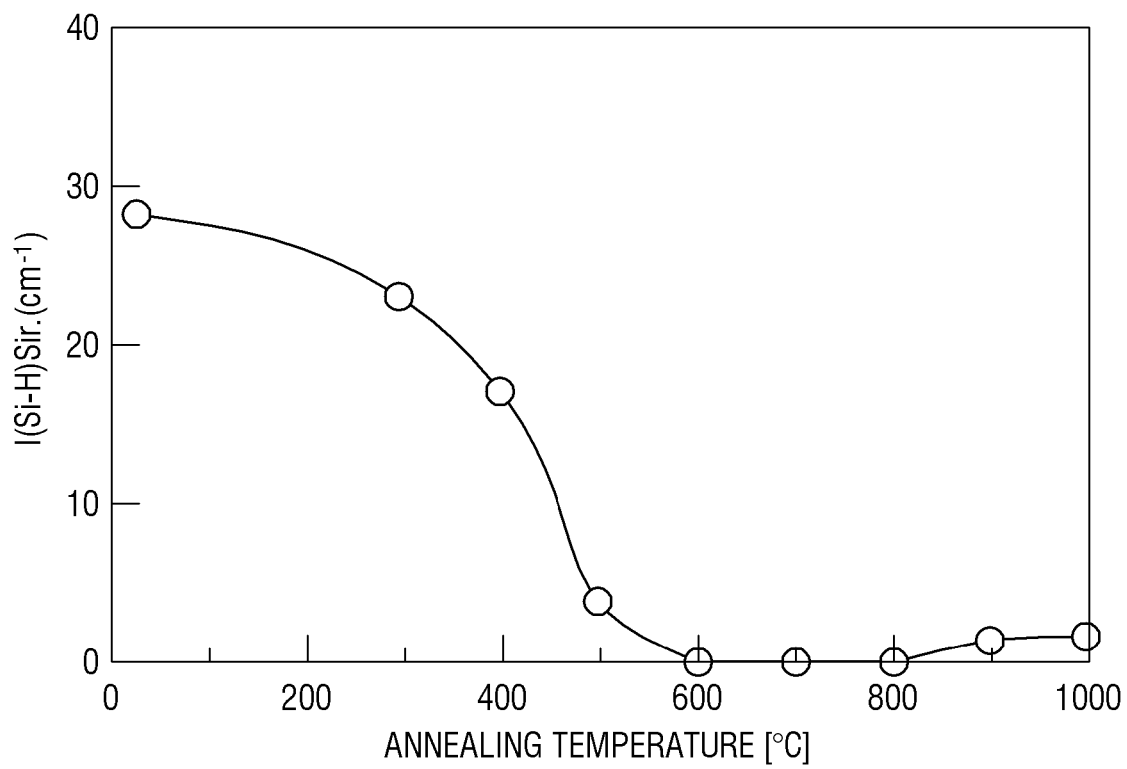
FIG. 11 is a graph showing a binding rate of silicon and hydrogen according to a temperature.

FIG. 7 is a table showing film formation conditions, thin film characteristics, and a release amount of hydrogen of silicon nitride releasing an excessive amount of hydrogen. FIG. 8 is a table showing film formation conditions, thin film characteristics, and a release amount of hydrogen of silicon nitride releasing a low amount of hydrogen. FIG. 9 is a table showing film formation conditions, thin film characteristics, and a release amount of hydrogen of silicon nitride releasing a minimum amount of hydrogen. FIG. 10 is a graph showing a binding rate of nitrogen and hydrogen according to a temperature. FIG. 11 is a graph showing a binding rate of silicon and hydrogen according to a temperature.

In graphs of FIGS. 7 to 9 related to a release amount of hydrogen, a horizontal axis shows a temperature (° C.), and a vertical axis shows intensity (A) according to a measured amount of hydrogen. In FIGS. 10 and 11, a horizontal axis shows an annealing temperature (° C.), and a vertical axis shows intensity according to intensity of a measured amount of a first bond and intensity of a measured amount of a second bond.

Referring to FIGS. 7 to 11, the first interlayer insulating layer 113 may include silicon nitride releasing a low amount of hydrogen or silicon nitride releasing a minimum amount of hydrogen.

First, referring to FIGS. 7 to 9, a method of manufacturing the first interlayer insulating layer 113 according to an embodiment will be described.

The first interlayer insulating layer 113 may be formed on the base substrate 101. As described above with reference to FIG. 5, the buffer layer 102, the barrier layer 103, the first insulating layer 111, and the second insulating layer 112 may be disposed between the first interlayer insulating layer 113 and the base substrate 101.

The first interlayer insulating layer 113 may include nitrogen, hydrogen, and silicon.

The first interlayer insulating layer 113 may be formed on the base substrate 101 through a film forming process.

The forming of the first interlayer insulating layer 113 may include supplying ammonia ($NH_3$), nitrogen ($N_2$), and silane ($SiH_4$) and binding the supplied ammonia ($NH_3$), nitrogen ($N_2$), and silane ($SiH_4$) to each other.

As shown in FIG. 8, in the supplying of the ammonia ($NH_3$), the nitrogen ($N_2$), and the silane ($SiH_4$), a supply ratio of the ammonia ($NH_3$) to the silane ($SiH_4$) may be in a range of about 5 to about 30 in the case of the silicon nitride releasing a low amount of hydrogen.

For example, in the supplying of the ammonia ($NH_3$), the nitrogen ($N_2$), and the silane ($SiH_4$) the supply ratio of the ammonia ($NH_3$) to the silane ($SiH_4$) may be about 10 in the case of the silicon nitride releasing a low amount of hydrogen.

As shown in FIG. 9, in the supplying of the ammonia ($NH_3$), the nitrogen ($N_2$), and the silane ($SiH_4$), a supply ratio of the ammonia ($NH_3$) to the silane ($SiH_4$) may be about zero in the case of the silicon nitride releasing a minimum amount of hydrogen. For example, the ammonia ($NH_3$) may not be supplied.

On the other hand, in the case of the silicon nitride releasing an excessive amount of hydrogen, as shown in FIG. 7, a supply ratio of the ammonia ($NH_3$) to the silane ($SiH_4$) may be less than about 5. For example, in the case of the silicon nitride releasing an excessive amount of hydrogen, the supply ratio of the ammonia ($NH_3$) to the silane ($SiH_4$) may be about 4.

Referring to FIG. 8, in the supplying of the ammonia ($NH_3$), the nitrogen ($N_2$), and the silane ($SiH_4$), a supply ratio of the nitrogen ($N_2$) to the silane ($SiH_4$) may be in a range of about 30 to about 150 in the case of the silicon nitride releasing a low amount of hydrogen.

For example, in the supplying of the ammonia ($NH_3$), the nitrogen ($N_2$), and the silane ($SiH_4$), the supply ratio of the nitrogen ($N_2$) to the silane ($SiH_4$) may be about 60 in the case of the silicon nitride releasing a low amount of hydrogen.

Referring to FIG. 9, in the supplying of the ammonia ($NH_3$), the nitrogen ($N_2$), and the silane ($SiH_4$), a supply ratio of the nitrogen ($N_2$) to the silane ($SiH_4$) may be in a range of about 150 to about 210 in the case of the silicon nitride releasing a minimum amount of hydrogen.

For example, in the supplying of the ammonia ($NH_3$), the nitrogen ($N_2$), and the silane ($SiH_4$), the supply ratio of the nitrogen ($N_2$) to the silane ($SiH_4$) may be about 180 in the case of the silicon nitride releasing a minimum amount of hydrogen.

On the other hand, in the case of the silicon nitride releasing an excessive amount of hydrogen, as shown in FIG. 7, a supply ratio of the nitrogen ($N_2$) to the silane may be in a range of about 5 to about 15. For example, in the case of the silicon nitride releasing an excessive amount of hydrogen, the supply ratio of the nitrogen ($N_2$) to the silane ($SiH_4$) may be about 10.

Describing thin film characteristics of the first interlayer insulating layer 113 with reference to FIG. 8, in the first interlayer insulating layer 113, nitrogen and hydrogen are combined through a first bond, and silicon and hydrogen are combined through a second bond. In the case of the silicon nitride releasing a low amount of hydrogen, as shown in FIG. 8, a ratio of the first bond to the second bond may be in a range of about 15 to about 30. For example, the ratio of the first bond to the second bond may be about 22.

In the case of the silicon nitride releasing a minimum amount of hydrogen, as shown in FIG. 9, a ratio of the first bond to the second bond may be in a range of about 15 to about 30. For example, the ratio of the first bond to the second bond may be about 18.

On the other hand, in the case of the silicon nitride releasing an excessive amount of hydrogen, as shown in FIG. 7, a ratio of the first bond to the second bond may be less than about 14. For example, the ratio of the first bond to the second bond may be about 0.6.

Describing a hydrogen content of the first interlayer insulating layer 113, in the case of the silicon nitride releasing a low amount of hydrogen, as shown in FIG. 8, the hydrogen content is about 22 at %, in the case of the silicon nitride releasing a minimum amount of hydrogen, as shown in FIG. 9, the hydrogen content is about 14 at %, and in the case of the silicon nitride releasing an excessive amount of hydrogen, as shown in FIG. 7, the hydrogen content is about 19 at %.

A ratio of the first bond between nitrogen and hydrogen to the second bond between silicon and hydrogen may be related to hydrogen release characteristics of the first interlayer insulating layer 113.

Referring to FIGS. 10 and 11, as an annealing temperature is increased, the second bond between silicon and hydrogen is more easily broken as compared with the first bond between nitrogen and hydrogen.

For example, in the case of the silicon nitride releasing a low amount of hydrogen or the silicon nitride releasing a minimum amount of hydrogen, in which a ratio of the first bond is relatively greater than that of the second bond in the first interlayer insulating layer 113, a bond is easily broken as compared with the silicon nitride releasing an excess amount of hydrogen, and thus, more hydrogen releasable to the outside of a film is generated.

Referring to FIGS. 7 to 9, in the case of the silicon nitride releasing a low amount of hydrogen and silicon nitride releasing a minimum amount of hydrogen, the measured intensity according to an amount of hydrogen released and measured at a temperature ranging from about 50° C. to about 550° C. may be at most about 2.0E-09. However, in the case of the silicon nitride releasing an excess amount of hydrogen, the measured intensity according to an amount of hydrogen released and measured at a temperature ranging from about 50° C. to about 350° C. may be at most about 2.0E-09 but measured intensity according to an amount of hydrogen released and measured at a temperature ranging from about 350° C. to about 550° C. may be at least about 2.0E-09.

As described above, in the case of the silicon nitride releasing a low amount of hydrogen, the hydrogen content is about 22 at %, in the case of the silicon nitride releasing a minimum amount of hydrogen, the hydrogen content is about 14 at %, and in the case of the silicon nitride releasing an excessive amount of hydrogen, the hydrogen content is about 19 at %. Thus, the hydrogen content of the silicon nitride releasing a low amount of hydrogen is greater than the hydrogen content of the silicon nitride releasing an excessive amount of hydrogen but a release amount of hydrogen of the silicon nitride releasing a low amount of hydrogen is relatively less than that of the silicon nitride releasing an excessive amount of hydrogen at a temperature of at least about 350° C.

Figure 12:
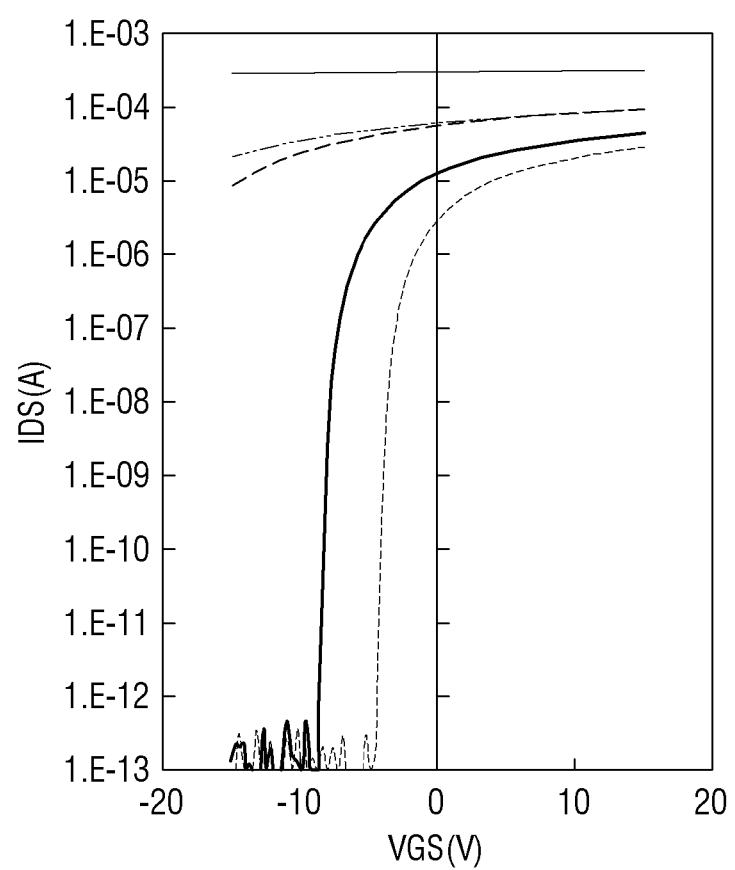
FIG. 12 is a graph showing a driving current according to a gate-source voltage when a first interlayer insulating layer is omitted.
Figure 13:
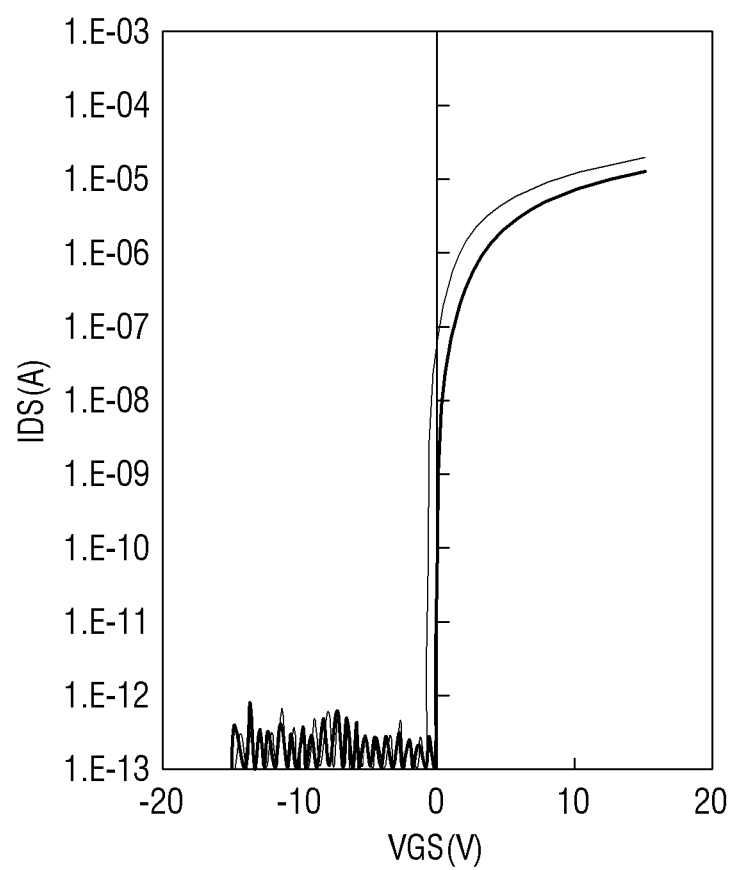
FIG. 13 is a graph showing a driving current according to a gate-source voltage when a first interlayer insulating layer is provided.
Figure 14:
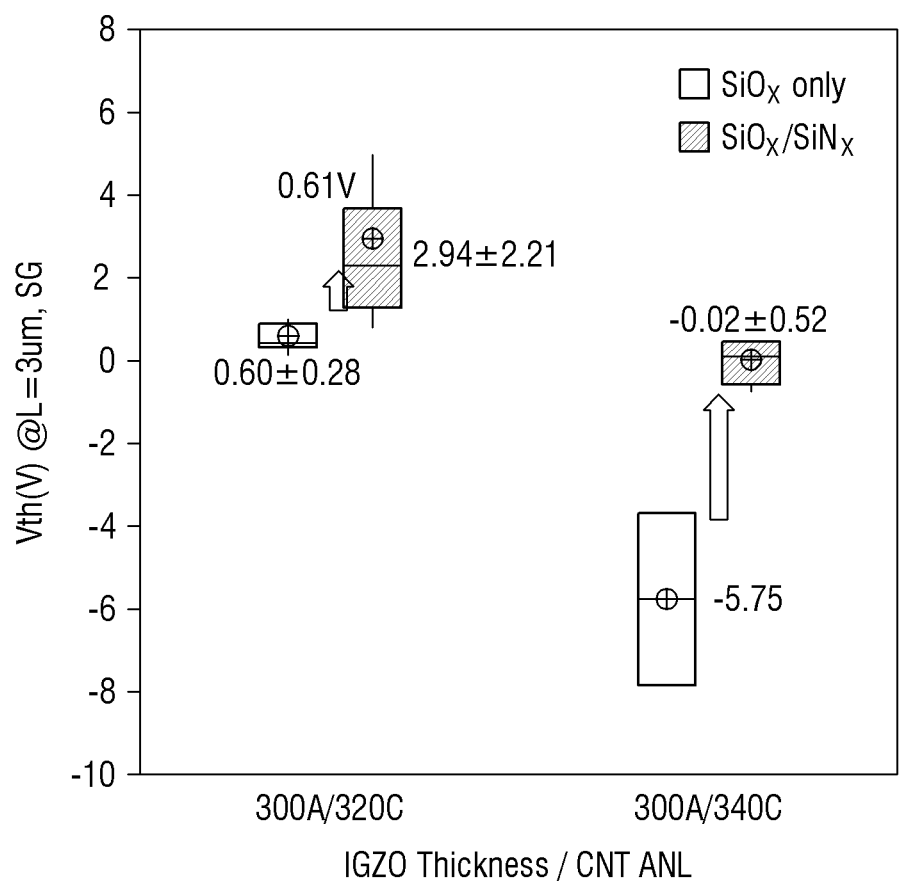
FIG. 14 is a graph showing threshold voltages according to a temperature when a first interlayer insulating layer is omitted and when the first interlayer insulating layer is provided.

FIG. 12 is a graph showing a driving current according to a gate-source voltage when the first interlayer insulating layer is omitted. FIG. 13 is a graph showing a driving current according to a gate-source voltage when the first interlayer insulating layer is provided. FIG. 14 is a graph showing threshold voltages according to a temperature when the first interlayer insulating layer is omitted and when the first interlayer insulating layer is provided. In FIGS. 12 and 13, a horizontal axis shows a gate-source voltage VGS (V), and a vertical axis shows a driving current (A). In FIG. 14, a horizontal axis shows a temperature (° C.), and a vertical axis shows a threshold voltage Vth (V).

Referring to FIGS. 12 to 14, when the first interlayer insulating layer 113 is omitted and only the second interlayer insulating layer 114 is provided below the second semiconductor layer 145, the threshold voltage Vth (V) is shifted in a negative direction as compared with when the first interlayer insulating layer 113 and the second interlayer insulating layer 114 are provided together below the second semiconductor layer 145. In other words, when the first interlayer insulating layer 113 and the second interlayer insulating layer 114 are provided together below the second semiconductor layer 145, the threshold voltage Vth (V) is shifted in a positive direction as compared with when the first interlayer insulating layer 113 is omitted and only the second interlayer insulating layer 114 is provided below the second semiconductor layer 145.

When the first interlayer insulating layer 113 is omitted and only the second interlayer insulating layer 114 is provided below the second semiconductor layer 145, and when the threshold voltage Vth (V) is shifted in the negative direction and is lowered to a level less than or equal to a certain voltage, a short circuit continuously occurs in which the driving current IDS (A) flows.

As shown in FIG. 14, under conditions in which the channel region CH has a length of about 3 μm, a temperature is about 320° C., and an overall thickness of the interlayer insulating layer is about 300 Å, when the first interlayer insulating layer 113 and the second interlayer insulating layer 114 are provided together, the threshold voltage Vth (V) is further increased as compared with the threshold voltage Vth (V) when the first interlayer insulating layer 113 is omitted and only the second interlayer insulating layer 114 is provided.

For example, under conditions in which the channel region CH has a length of about 3 μm and a temperature is about 320° C., when the first interlayer insulating layer 113 and the second interlayer insulating layer 114 are provided together, the threshold voltage Vth (V) may be about 2.9 V on average, and when the first interlayer insulating layer 113 is omitted and only the second interlayer insulating layer 114 is provided, the threshold voltage Vth (V) may be about 0.60 V on average.

Similarly, under conditions in which the channel region CH has a length of about 3 μm and a temperature is about 340° C., when the first interlayer insulating layer 113 and the second interlayer insulating layer 114 are provided together, the threshold voltage Vth (V) is further increased as compared with the threshold voltage Vth (V) when the first interlayer insulating layer 113 is omitted and only the second interlayer insulating layer 114 is provided.

For example, under conditions in which the channel region CH has a length of about 3 μm and a temperature is about 340° C., when the first interlayer insulating layer 113 and the second interlayer insulating layer 114 are provided together, the threshold voltage Vth (V) may be about −0.02 V on average, and when the first interlayer insulating layer 113 is omitted and only the second interlayer insulating layer 114 is provided, the threshold voltage Vth (V) may be about −5.75 V on average.

In the display device 1 according to the embodiment, the first interlayer insulating layer 113 including silicon nitride with excellent hydrogen inflow characteristics may be further disposed below the second semiconductor layer 145 and the second interlayer insulating layer 114, thereby greatly reducing a degree in which hydrogen ions flow into the channel region CH.

As described above, in a process of forming the first interlayer insulating layer 113, input amounts of ammonia (NH$_3$), nitrogen (N$_2$), and silane (SiH$_4$) may be adjusted to adjust a ratio of the first bond between the nitrogen and the hydrogen to the second bond between the silicon and the hydrogen, thereby reducing a release amount of the hydrogen.

As a result, a degree in which hydrogen ions flow into the channel region CH may be reduced to shift an overall threshold voltage Vth (V) of a transistor in a positive direction, thereby securing a margin of the threshold voltage Vth (V). The threshold voltage may be suppressed from being shifted in a negative direction to prevent an amount of hydrogen ions greater than a reference value from flowing into the second semiconductor layer 145, thereby preventing defects in switching characteristics of the transistor.

Hereinafter, display devices according to other embodiments will be described. In the following embodiments, the same reference numerals will be given to the same components as the embodiments described above, and descriptions thereof will be omitted or simplified.

Figure 15:
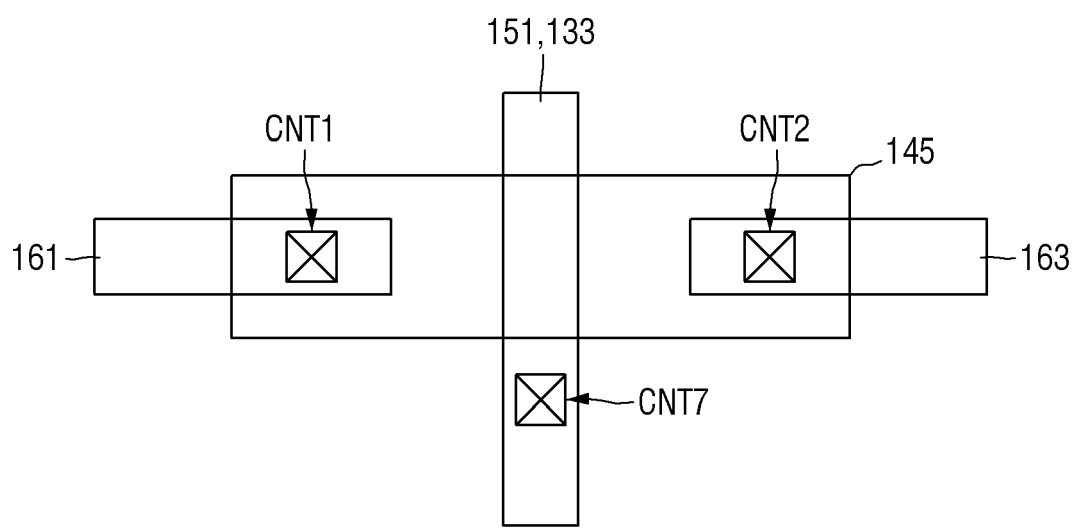
FIG. 15 is a plan layout illustrating one transistor disposed in a first area according to another embodiment.
Figure 16:
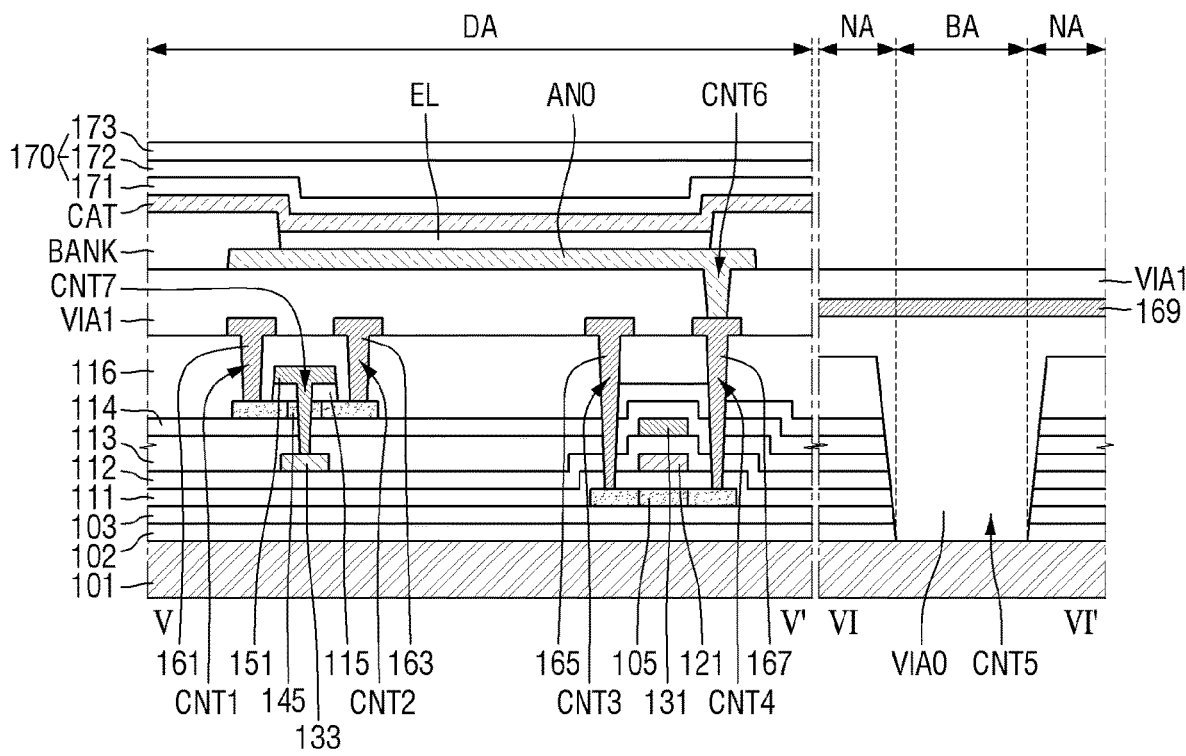
FIG. 16 is a schematic cross-sectional view illustrating a display device according to another embodiment.
Figure 17:
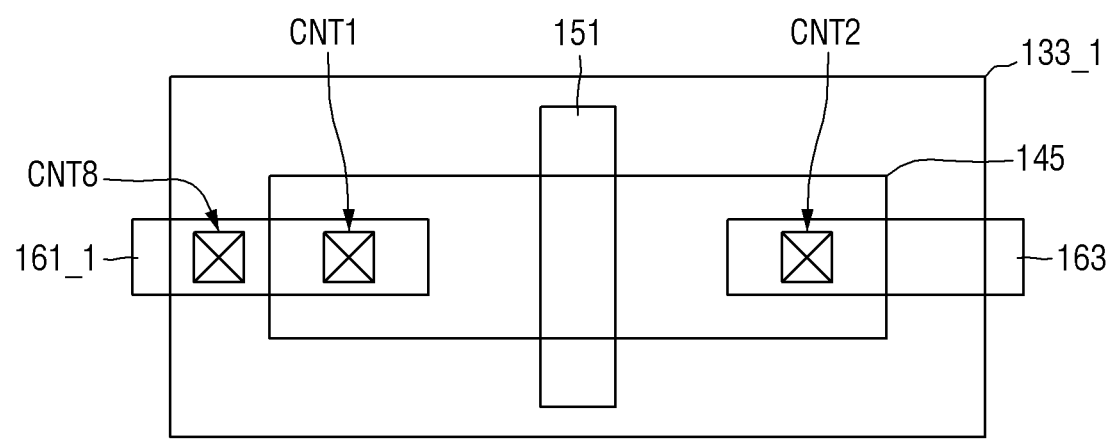
FIG. 17 is a plan layout illustrating one transistor disposed in a first area according to still another embodiment.
Figure 18:
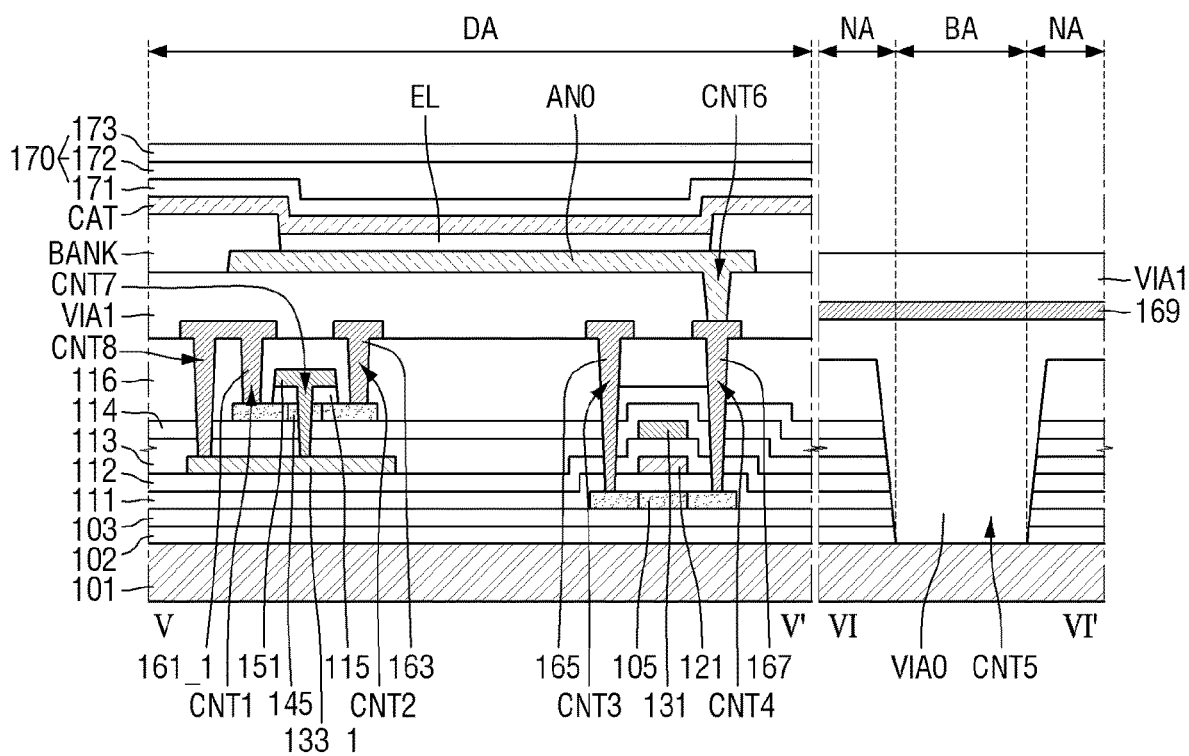
FIG. 18 is a schematic cross-sectional view illustrating a display device according to still another embodiment.
Figure 19:
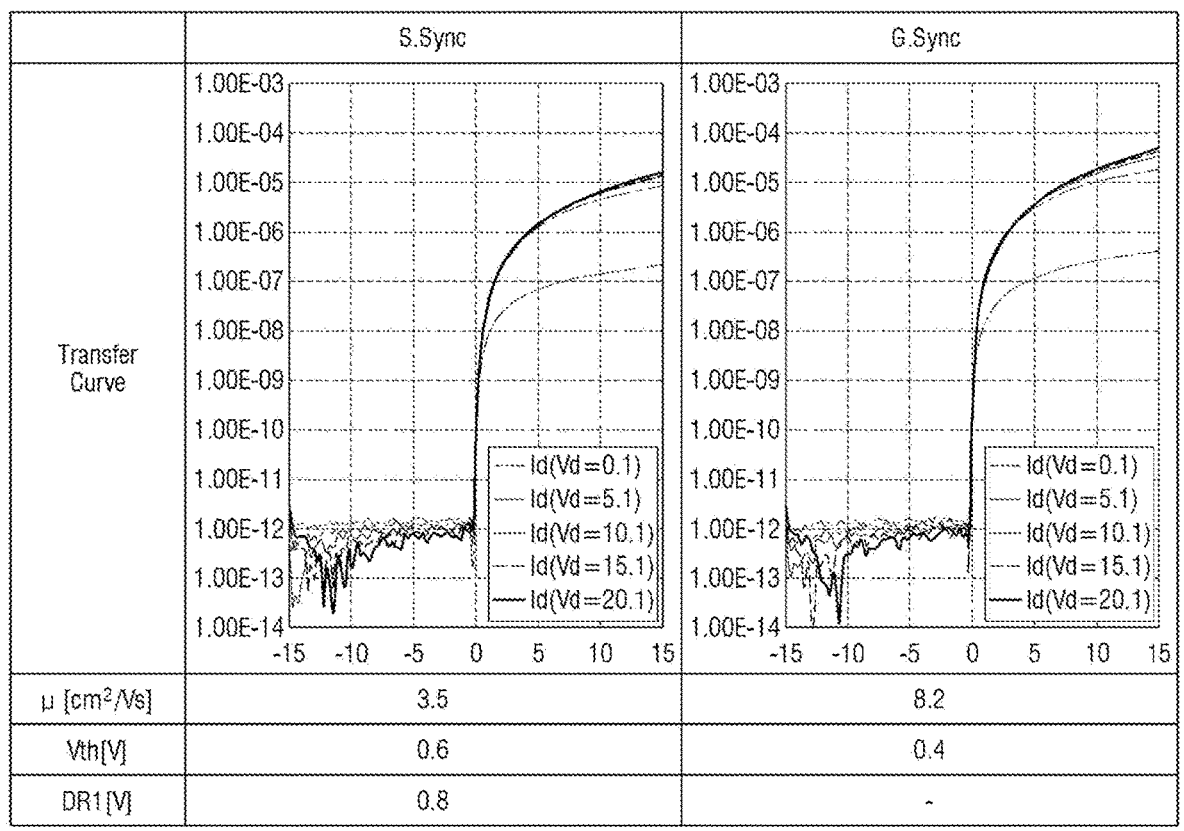
FIG. 19 is a graph showing driving currents according to a gate-source voltage of FIGS. 15 and 16 and FIGS. 17 and 18.
Figure 20:
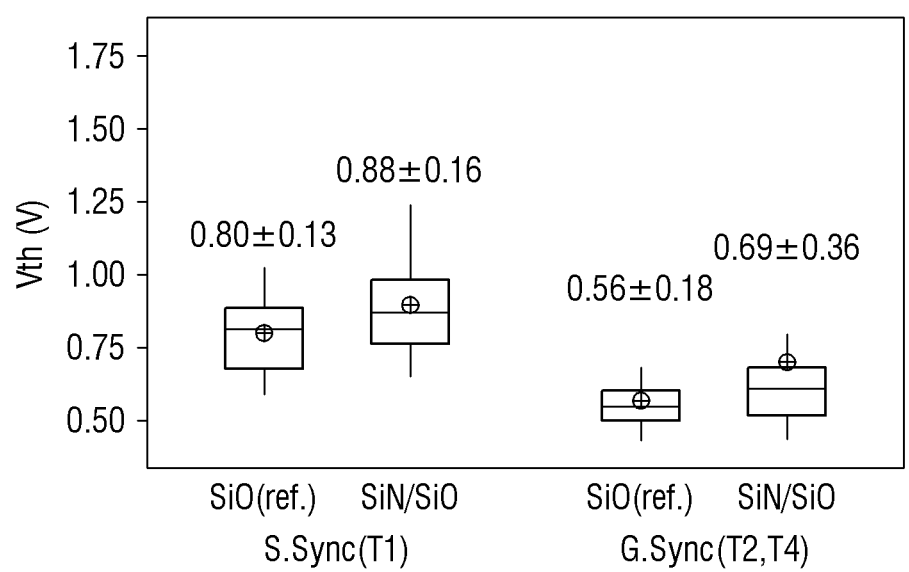
FIG. 20 is a graph showing threshold voltages when a first interlayer insulating layer is omitted and when the first interlayer insulating layer is provided.

FIG. 15 is a plan view diagram illustrating one transistor disposed in a first area according to another embodiment. FIG. 16 is a schematic cross-sectional view illustrating a display device according to another embodiment. FIG. 17 is a plan view diagram illustrating one transistor disposed in a first area according to still another embodiment. FIG. 18 is a schematic cross-sectional view illustrating a display device according to still another embodiment. FIG. 19 is a graph showing driving currents according to a gate-source voltage of FIGS. 15 and 16 and FIGS. 17 and 18. FIG. 20 is a graph showing threshold voltages when a first interlayer insulating layer is omitted and when the first interlayer insulating layer is provided.

FIGS. 15, 16, 17, and 18 show modified examples of a transistor of a display device.

Referring to FIGS. 15 and 16, a display device 2 according to another embodiment is different from the display device 1 of FIG. 5 in that the display device 2 further includes a fourth gate electrode 133 between a second insulating layer 112 and a first interlayer insulating layer 113.

The fourth gate electrode 133 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Er), chromium (Cr), calcium (Ca), titanium (Ti), tantalum (Ta), tungsten (W), and copper (Cu). The fourth gate electrode 133 may be a single film or a multilayer film.

The fourth gate electrode 133 may be disposed in a second conductive layer 130_1. In other words, the second conductive layer 130_1 may further include the fourth gate electrode 133. However, the disclosure is not limited thereto, and the fourth gate electrode 133 may be disposed in the second conductive layer 130_1 and may also be disposed in other layers.

The fourth gate electrode 133 may be electrically connected to a first gate electrode 151 through a seventh contact hole CNT7. The same scan signal may be applied to the fourth gate electrode 133 and the first gate electrode 151, and the fourth gate electrode 133 and the first gate electrode 151 may adjust turn-on/off of a channel of a transistor on the basis of the same scan signal. A transistor structure, in which the fourth gate electrode 133 is electrically connected to the first gate electrode 151 through the seventh contact hole CNT7, may be a switching transistor structure.

The seventh contact hole CNT7 may pass through a third insulating layer 115, a second interlayer insulating layer 114, and the first interlayer insulating layer 113 which are disposed below the first gate electrode 151.

The first gate electrode 151 may be disposed to overlap the fourth gate electrode 133 in a thickness direction thereof on a plan view. A planar size of the fourth gate electrode 133 may be substantially the same as a planar size of the first gate electrode 151, but the disclosure is not limited thereto.

The fourth gate electrode 133 and the first gate electrode 151 may be disposed to extend further to an upper side and a lower side of a second semiconductor layer 145. The seventh contact hole CNT7 may be formed in portions of the fourth gate electrode 133 and the first gate electrode 151 which extend further as compared with the second semiconductor layer 145.

Referring to FIGS. 19 and 20, even in a structure in which the fourth gate electrode 133 is electrically connected to the first gate electrode 151 through the seventh contact hole CNT7, in the display device 2, the first interlayer insulating layer 113 including silicon nitride with excellent hydrogen inflow characteristics may be further disposed below the second semiconductor layer 145 and the second interlayer insulating layer 114, thereby greatly reducing a degree to which hydrogen ions flow into a channel region CH.

As described above, in a process of forming the first interlayer insulating layer 113, input amounts of ammonia (NH$_3$), nitrogen (N$_2$), and silane (SiH$_4$) may be adjusted to adjust a ratio of a first bond between nitrogen and hydrogen to a second bond between silicon and hydrogen, thereby reducing a release amount of the hydrogen.

As a result, a degree to which hydrogen ions flow into the channel region CH may be reduced to shift an overall threshold voltage Vth (V) of a transistor in a positive direction, thereby securing a margin of the threshold voltage Vth (V). The threshold voltage may be suppressed from being shifted in a negative direction to prevent an amount of hydrogen ions greater than a reference value from flowing into the second semiconductor layer 145, thereby preventing defects in switching characteristics of the transistor.

Referring to FIGS. 17 and 18, a display device 3 according to still another embodiment is different from the display device 1 of FIG. 5 in that the display device 3 further includes a fourth gate electrode 133_1 between a second insulating layer 112 and a first interlayer insulating layer 113 and a first source/drain electrode 161_1 or 163 is additionally in contact with the fourth gate electrode 133_1.

The fourth gate electrode 133_1 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth gate electrode 133_1 may be a single film or a multilayer film.

The fourth gate electrode 133_1 may be disposed in a second conductive layer 130_2, but as described above with reference to FIGS. 15 and 16, of course, the disclosure is not limited thereto.

The fourth gate electrode 133_1 may be electrically connected to the first source electrode 161_1 or the first drain electrode 163 through an eighth contact hole CNT8. A transistor structure, in which the fourth gate electrode 133_1 is electrically connected to the first source electrode 161_1 or the first drain electrode 163 through the eighth contact hole CNT8, may be a driving transistor structure.

The eighth contact hole CNT8 may pass through a third interlayer insulating layer 116, a second interlayer insulating layer 114, and the first interlayer insulating layer 113 which are disposed below the first source electrode 161_1 or the first drain electrode 163. The fourth gate electrode 1331 may extend further outward from a second semiconductor layer 145. The fourth gate electrode 133_1 may be electrically connected to the first source electrode 161_1 or the first drain electrode 163 through the eighth contact hole CNT8 in an area in which the fourth gate electrode 133_1 extends further outward from the second semiconductor layer 145.

The fourth gate electrode 133_1 may be disposed to overlap a first gate electrode 151 in a thickness direction thereof in a plan view, and a planar size thereof may be greater than a planar size of the first gate electrode 151.

Referring again to FIGS. 19 and 20, even in a structure in which the fourth gate electrode 1331 is electrically connected to the first source electrode 1611 or the first drain electrode 163 through the eighth contact hole CNT8, in the display device 3, the first interlayer insulating layer 113 including silicon nitride with excellent hydrogen inflow characteristics may be further disposed below the second semiconductor layer 145 and the second interlayer insulating layer 114, thereby greatly reducing a degree in which hydrogen ions flow into a channel region CH.

As described above, in a process of forming the first interlayer insulating layer 113, input amounts of ammonia ($NH_3$), nitrogen ($N_2$), and silane ($SiH_4$) may be adjusted to adjust a ratio of a first bond between nitrogen and hydrogen to a second bond between silicon and hydrogen, thereby reducing a release amount of the hydrogen.

Figure 21:
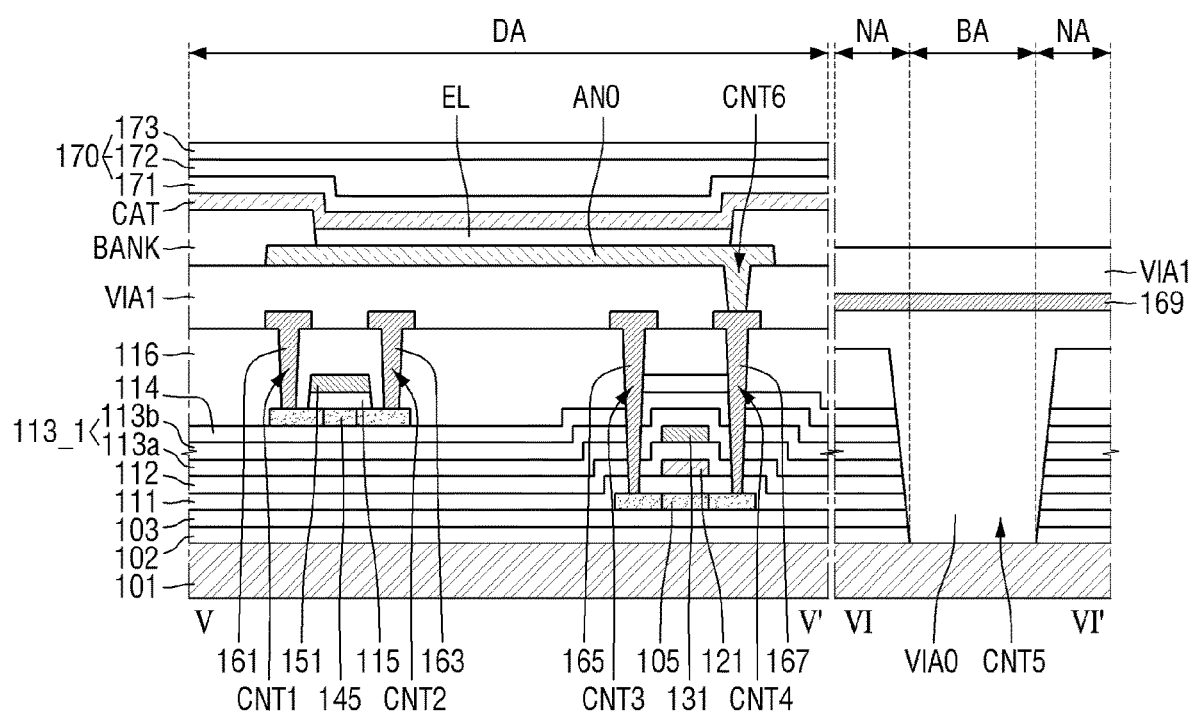
FIG. 21 is a schematic cross-sectional view illustrating a display device according to yet another embodiment.

FIG. 21 is a cross-sectional view illustrating a display device according to yet another embodiment.

Referring to FIG. 21, a display device 4 according to the embodiment is different from the display device 1 of FIG. 5 in that a first interlayer insulating layer 113_1 includes stacked films.

More specifically, the first interlayer insulating layer 113_1 includes stacked films 113a and 113b. A first sub-insulating layer 113a may include the above-described silicon nitride releasing a low amount of hydrogen, and a second sub-insulating layer 113b disposed between the first sub-insulating layer 113a and a second interlayer insulating layer 114 may include the above-described silicon nitride releasing a minimum amount of hydrogen.

Figure 22:
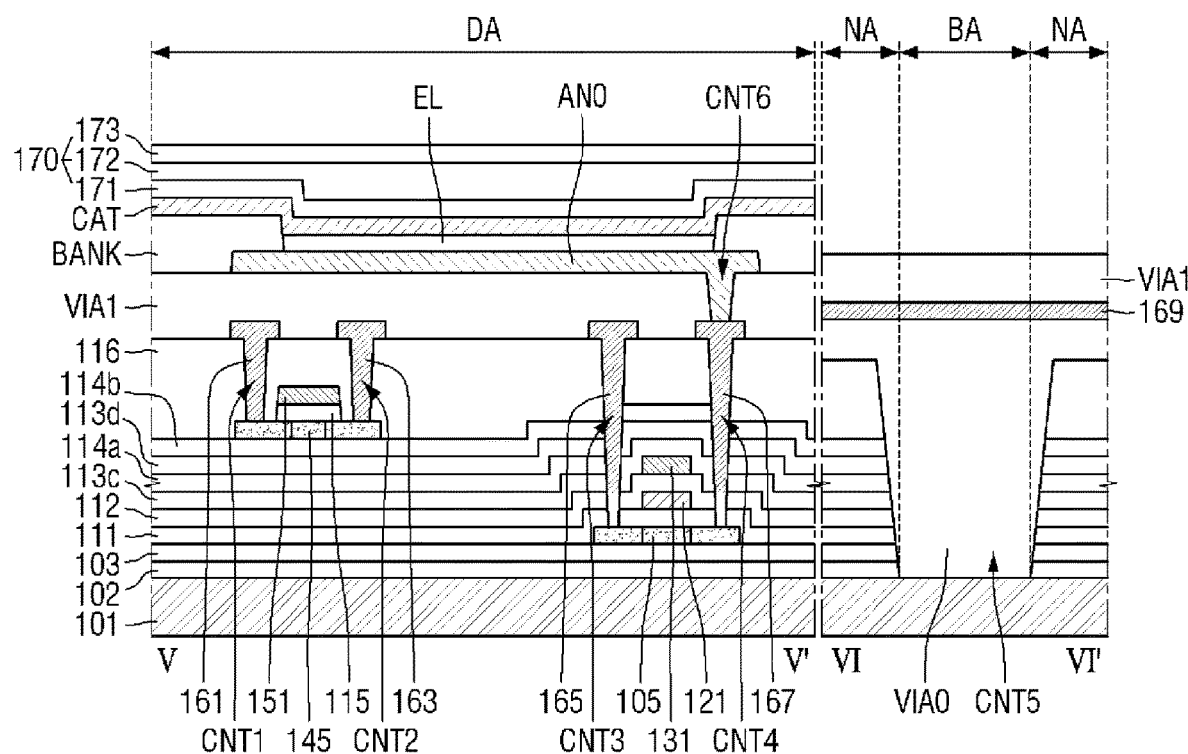
FIG. 22 is a schematic cross-sectional view illustrating a display device according to yet another embodiment.

FIG. 22 is a cross-sectional view illustrating a display device according to yet another embodiment.

Referring to FIG. 22, a display device 5 according to the embodiment is different from the display device 1 of FIG. 5 in that a first interlayer insulating layer includes stacked films and a second interlayer insulating layer includes stacked films.

More specifically, a first sub-insulating layer 113c of the first interlayer insulating layer is disposed between a second insulating layer 112 and a second semiconductor layer 145. A first sub-insulating layer 114a of the second interlayer insulating layer may be disposed between the first sub-insulating layer 113c of the first interlayer insulating layer and the second semiconductor layer 145. A second sub-insulating layer 113d of the first interlayer insulating layer may be disposed between the first sub-insulating layer 114a of the second interlayer insulating layer and the second semiconductor layer 145. A second sub-insulating layer 114b of the second interlayer insulating layer may be disposed between the first sub-insulating layer 114a of the second interlayer insulating layer and the second semiconductor layer 145.

The first sub-insulating layer 114a and the second sub-insulating layer 114b of the second interlayer insulating layer may be made of the same material.

The first sub-insulating layer 113c of the first interlayer insulating layer may include the above-described silicon nitride releasing a low amount of hydrogen, and the second sub-insulating layer 113d of the first interlayer insulating layer may include the above-described silicon nitride releasing a minimum amount of hydrogen.

According to a display device and a method of manufacturing a display device according to an embodiment, it is possible to prevent a short circuit of an oxide semiconductor.

Effects of the disclosure are not restricted to the embodiments set forth herein and more diverse effects are included in this specification.

Although the embodiments of the disclosure have been described with reference to the accompanying drawings, it will be understood by those skilled in the art to which the disclosure pertains that the disclosure can be carried out in other detailed forms without changing the technical spirits and essential features thereof. Therefore, it should be understood that the embodiments described herein are illustrative and not restrictive in all aspects.

What is claim is:

1. A display device comprising:
    a substrate including a display area and a non-display area around the display area;
    a first insulating layer disposed on the substrate;
    a second insulating layer disposed on the first insulating layer;
    a first semiconductor layer disposed on the second insulating layer;
    a third insulating layer on the first semiconductor layer;
    a first gate electrode on the third insulating layer;
    a fourth insulating layer disposed on the first gate electrode;
    a second gate electrode on the fourth insulating layer;
    a fifth insulating layer on the second gate electrode;
    a sixth insulating layer on the fifth insulating layer;
    a second semiconductor layer on the sixth insulating layer;
    an seventh insulating layer on the second semiconductor layer;
    a third gate electrode on the seventh insulating layer;
    a eighth insulating layer on the third gate electrode;
    a first source electrode or a second drain electrode on the eighth insulating layer; and
    a third source electrode or a fourth drain electrode on the eighth insulating layer, wherein
    a material of the fifth insulating layer is different from a material of the sixth insulating layer,
    the first source or the second drain electrode is electrically connected to the first semiconductor layer,
    the third source electrode or the fourth drain electrode is electrically connected to the second semiconductor layer,
    the fifth insulating comprises silicon nitride ($SiN_x$),
    wherein the sixth insulating layer comprises silicon oxide ($SiO_x$),
    the first semiconductor layer includes crystal silicon, and
    the second semiconductor layer includes an oxide.

2. The display device of 1, further comprising:
    a ninth insulating layer, a pixel electrode, an organic light-emitting element, a cathode electrode, and a thin encapsulation layer on the first source electrode, the second drain electrode, the third source electrode, or the fourth drain electrode, wherein the ninth insulating layer, the pixel electrode, the organic light-emitting element, the cathode electrode, and the thin encapsulation layer are sequentially stacked.

3. The display device of claim 2, further comprising:
a switching transistor including the second semiconductor layer, the third gate electrode, and the third source electrode and fourth electrode; and
a driving transistor including the first semiconductor layer, the first gate electrode, and the first source electrode and the second drain electrode.

4. A display device comprising:
a substrate including a display area and a non-display area around the display area;
a first semiconductor layer disposed on the substrate;
a first insulating layer on the first semiconductor layer;
a first gate electrode on the first insulating layer;
a second insulating layer disposed on the first gate electrode;
a second gate electrode on the second insulating layer;
a third insulating layer on the second gate electrode;
a fourth insulating layer on the third insulating layer;
a second semiconductor layer on the fourth insulating layer;
a fifth insulating layer on the second semiconductor layer;
a third gate electrode on the fifth insulating layer;
a sixth insulating layer on the third gate electrode;
a first source electrode or a second drain electrode on the sixth insulating layer; and
a third source electrode or a fourth drain electrode on the sixth insulating layer; wherein
a material of the third insulating layer is different from a material of the fourth insulating layer,
the first source or the second drain electrode is electrically connected to the first semiconductor layer,
the third source electrode or the fourth drain electrode is electrically connected to the second semiconductor layer,
the third insulating layer contacts the fourth insulating layer,
the fourth insulating layer contacts the second semiconductor layer,
the third insulating comprises silicon nitride ($SiN_x$),
the fourth insulating layer comprises silicon oxide ($SiO_x$),
the first semiconductor layer includes crystal silicon, and
the second semiconductor layer includes an oxide.

5. The display device of 4, further comprising:
a seventh insulating layer, a pixel electrode, an organic light-emitting element, a cathode electrode and a thin encapsulation layer on the first source electrode, the second drain electrode, the third source electrode or the fourth drain electrode, wherein
the seventh insulating layer, the pixel electrode, the organic light-emitting element, the cathode electrode and the thin encapsulation layer are sequentially stacked.

6. The display device of claim 5, further comprising:
a switching transistor including the second semiconductor layer, the third gate electrode, and the third source electrode and fourth electrode; and
a driving transistor including the first semiconductor layer, the first gate electrode, and the first source electrode and the second drain electrode.

7. The display device of claim 4, wherein each of the third insulating layer and the fourth insulating layer are disposed between the second semiconductor layer and the second gate electrode in a thickness direction of the display device.

8. The display device of claim 4, wherein
the third insulating layer comprises nitrogen, hydrogen, and silicon,
the nitrogen and the hydrogen are combined through a first bond,
the silicon and the hydrogen are combined through a second bond, and
a ratio of the first bond to the second bond is in a range of about 15 to about 30.

9. The display device of claim 8, wherein a release amount of the hydrogen of the third insulating layer is at most about 2.0E-09 at a temperature of at least about 350° C.

10. The display device of claim 4, wherein the third insulating layer is formed by supplying ammonia ($NH_3$), silane ($SiH_4$), and nitrogen ($N_2$) where a supply ratio of the ammonia ($NH_3$) to the silane ($SiH_4$) is at least about 5.

11. The display device of claim 10, wherein a supply ratio of the nitrogen ($N_2$) to the silane ($SiH_4$) is at least about 30.

12. The display device of claim 4, wherein the forming of the third insulating layer comprises supplying ammonia ($NH_3$), silane ($SiH_4$), and nitrogen ($N_2$) where a supply ratio of the ammonia ($NH_3$) to the silane ($SiH_4$) is about zero.

13. The display device of claim 12, wherein a supply ratio of the nitrogen ($N_2$) to the silane ($SiH_4$) is at least about 150.

14. The display device of claim 4, wherein each of the third insulating layer and the fourth insulating layer are comprised of a first sub-insulating layer and a second sub-insulating layer.

15. The display device of claim 14, wherein
the first sub-insulating layer of the third insulating layer is disposed between a second insulating layer and a second semiconductor layer,
the first sub-insulating layer of the fourth insulating layer is disposed between the first sub-insulating layer of the third insulating layer and the second semiconductor layer,
the second sub-insulating layer third insulating layer is disposed between the first sub-insulating layer of the fourth insulating layer and the second semiconductor layer, and
the second sub-insulating layer of the fourth insulating layer is disposed between the first sub-insulating layer of the fourth insulating layer and the second semiconductor layer.

16. The display device of claim 15, wherein
the first sub-insulating layer of the fourth insulating layer and the second sub-insulating layer of the fourth insulating layer are comprised of a same material, and
the second sub-insulating layer of the third insulating layer releases less hydrogen than the first sub-insulating layer of the third insulating layer.

* * * * *